US012119291B2

(12) United States Patent
Aleksov et al.

(10) Patent No.: US 12,119,291 B2
(45) Date of Patent: Oct. 15, 2024

(54) HERMETIC SEALING STRUCTURES IN MICROELECTRONIC ASSEMBLIES HAVING DIRECT BONDING

(71) Applicant: Intel Corporation, Santa Clara, CA (US)

(72) Inventors: Aleksandar Aleksov, Chandler, AZ (US); Mohammad Enamul Kabir, Portland, OR (US); Adel A. Elsherbini, Tempe, AZ (US); Shawna M. Liff, Scottsdale, AZ (US); Johanna M. Swan, Scottsdale, AZ (US); Feras Eid, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 743 days.

(21) Appl. No.: 17/121,093

(22) Filed: Dec. 14, 2020

(65) Prior Publication Data

US 2022/0189861 A1  Jun. 16, 2022

(51) Int. Cl.
*H01L 23/00* (2006.01)
*H01L 23/498* (2006.01)
(Continued)

(52) U.S. Cl.
CPC .... *H01L 23/49822* (2013.01); *H01L 23/5383* (2013.01); *H01L 24/08* (2013.01);
(Continued)

(58) Field of Classification Search
CPC .......... H01L 23/49822; H01L 23/5383; H01L 24/08; H01L 24/32; H01L 23/3135;
(Continued)

(56) References Cited

U.S. PATENT DOCUMENTS 6,809,384 B1   10/2004   Anderson et al.
7,968,976 B2   6/2011   Chang et al.
(Continued)

FOREIGN PATENT DOCUMENTS

JP   2011171656 A   9/2011
WO   2020242781 A1   12/2020

*Primary Examiner* — Elias Ullah
(74) *Attorney, Agent, or Firm* — Akona IP PC

(57) ABSTRACT

Disclosed herein are microelectronic assemblies including microelectronic components coupled by direct bonding, and related structures and techniques. In some embodiments, a microelectronic assembly may include a first microelectronic component including a first guard ring extending through at least a portion of a thickness of and along a perimeter; a second microelectronic component including a second guard ring extending through at least a portion of a thickness of and along a perimeter, where the first and second microelectronic components are coupled by direct bonding; and a seal ring formed by coupling the first guard ring to the second guard ring. In some embodiments, a microelectronic assembly may include a microelectronic component coupled to an interposer that includes a first liner material at a first surface; a second liner material at an opposing second surface; and a perimeter wall through the interposer and connected to the first and second liner materials.

19 Claims, 13 Drawing Sheets

(51) Int. Cl.
*H01L 23/538* (2006.01)
*H01L 23/31* (2006.01)
*H01L 23/48* (2006.01)

(52) U.S. Cl.
CPC .......... *H01L 24/32* (2013.01); *H01L 23/3135* (2013.01); *H01L 23/481* (2013.01); *H01L 23/49816* (2013.01); *H01L 23/49894* (2013.01); *H01L 2224/08225* (2013.01); *H01L 2224/32225* (2013.01)

(58) Field of Classification Search
CPC ............. H01L 23/481; H01L 23/49816; H01L 23/49894; H01L 2224/08225; H01L 2224/32225; H01L 2224/0401; H01L 2224/0557; H01L 2224/0603; H01L 2224/06181; H01L 2224/09181; H01L 2224/09517; H01L 2224/16227; H01L 2224/80006; H01L 2224/94; H01L 2224/95; H01L 2224/96; H01L 2225/06517; H01L 2225/06541; H01L 2225/06589; H01L 2924/15311; H01L 23/562; H01L 2221/68327; H01L 2221/68359; H01L 2924/15192; H01L 2924/3512; H01L 21/568; H01L 21/6835; H01L 25/0655; H01L 25/0657; H01L 25/50; H01L 23/3128; H01L 23/564
See application file for complete search history.

(56) References Cited

U.S. PATENT DOCUMENTS

| | | | |
|---|---|---|---|
| 8,168,529 | B2 | 5/2012 | Lin et al. |
| 8,217,473 | B2 | 7/2012 | Chen et al. |
| 10,141,239 | B2 | 11/2018 | Lin |
| 2011/0132652 | A1 | 6/2011 | Ding et al. |
| 2012/0168939 | A1 | 7/2012 | Chang et al. |
| 2014/0042643 | A1 | 2/2014 | Yu et al. |
| 2014/0124889 | A1 | 5/2014 | Qian et al. |
| 2014/0167292 | A1 | 6/2014 | Masumura et al. |
| 2016/0190103 | A1 | 6/2016 | Kabe et al. |
| 2016/0286660 | A1 | 9/2016 | Gambino et al. |
| 2017/0317004 | A1 | 11/2017 | Lin |
| 2018/0175012 | A1 | 6/2018 | Wu et al. |
| 2019/0164914 | A1 | 5/2019 | Hu et al. |
| 2020/0006309 | A1 | 1/2020 | Chen et al. |
| 2020/0211966 | A1 | 7/2020 | Raorane |
| 2020/0211977 | A1 | 7/2020 | Kim et al. |
| 2021/0305178 | A1* | 9/2021 | West ................... H01L 23/585 |
| 2022/0192042 | A1 | 6/2022 | Kabir et al. |

* cited by examiner

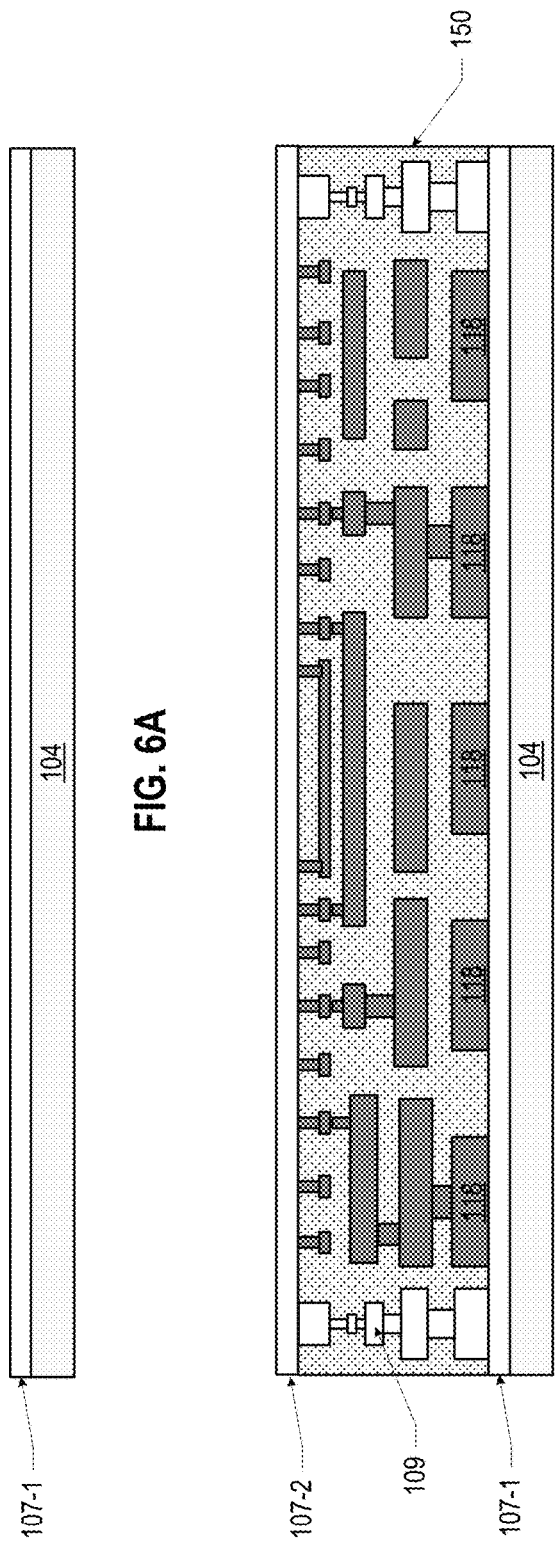
FIG. 6A
FIG. 6B
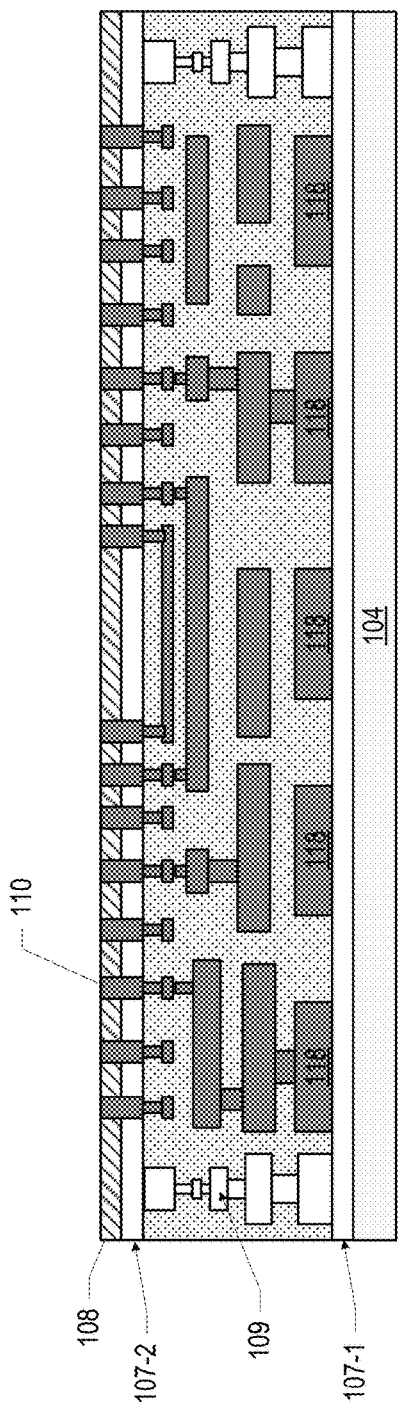
FIG. 6C

HERMETIC SEALING STRUCTURES IN MICROELECTRONIC ASSEMBLIES HAVING DIRECT BONDING

BACKGROUND

An integrated circuit (IC) package may include a die coupled to an organic substrate or to another die by direct bonding. A direct bonding region is susceptible to moisture or other fluid ingress, which can weaken the bond interface and negatively affect performance.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 6A-6E are side, cross-sectional views of example stages in the manufacture of a portion of the microelectronic assembly of FIG. 1, in accordance with various embodiments.

DETAILED DESCRIPTION

Figure 1:
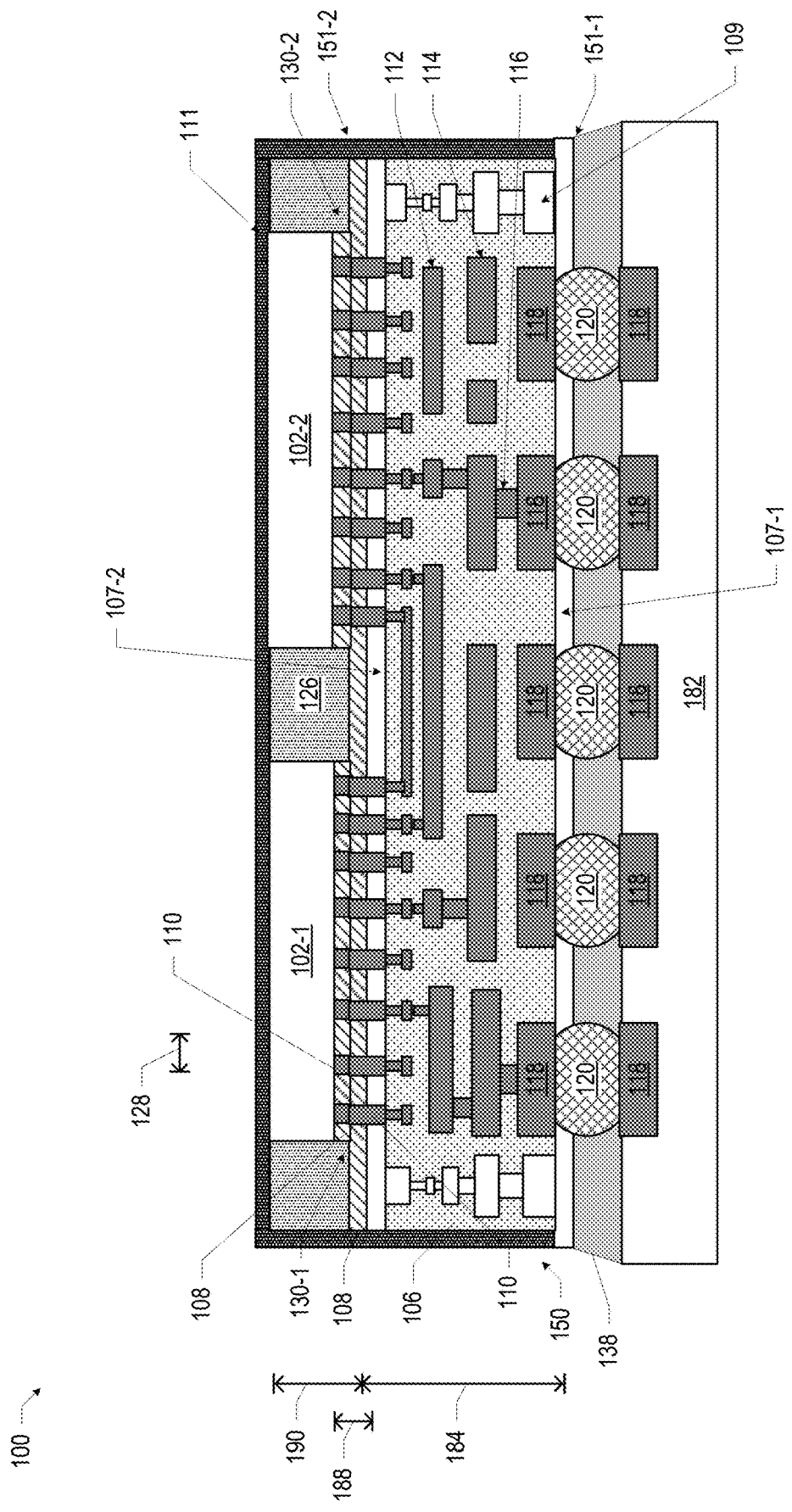
FIG. 1 is a side, cross-sectional view of an example microelectronic assembly including a hermetic sealing structure, in accordance with various embodiments.

Disclosed herein are microelectronic assemblies including microelectronic components having hermetic sealing structures that are coupled together by direct bonding regions, as well as related structures and techniques. For example, in some embodiments, a microelectronic assembly may include an interposer, having a dielectric material, and including a first liner material at a first surface; a second liner material at an opposing second surface; and a perimeter wall through the dielectric material and connected to the first and second liner materials; and a microelectronic component coupled to the second surface of the interposer by a direct bonding region. In another example, in some embodiments, a microelectronic assembly may include a first microelectronic component, having a first surface and an opposing second surface, including a guard ring extending from the second surface through at least a portion of a thickness of and along a perimeter of the first microelectronic component; a second microelectronic component, having a first surface and an opposing second surface, including a guard ring extending from the first surface through at least a portion of a thickness of and along a perimeter of the second microelectronic component, wherein the second surface of the first microelectronic component is coupled to the first surface of the second microelectronic component via a direct bonding region; and a seal ring between the first and second microelectronic components, wherein the guard ring at the second surface of the first microelectronic component is coupled to the guard ring at the first surface of the second microelectronic component to form the seal ring.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrases "A and/or B" and "A or B" mean (A), (B), or (A and B). For the purposes of the present disclosure, the phrases "A, B, and/or C" and "A, B, or C" mean (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. The terms "top," "bottom," etc. may be used herein to explain various features of the drawings, but these terms are simply for ease of discussion, and do not imply a desired or required orientation. Although certain elements may be referred to in the singular herein, such elements may include multiple sub-elements. For example, "a dielectric material" may include one or more dielectric materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via). For ease of discussion, the drawings of FIGS. 3A-3C may be referred to herein as "FIG. 3."

Communicating large numbers of signals in an integrated circuit (IC) package is challenging due to the increasingly small size of IC dies. Conventional techniques for electrically coupling a die to a die or a die to a substrate generally include solder and an underfill material. Direct bonding enables smaller conductive contacts and a smaller pitch, however, the direct bonding interface may be susceptible to moisture ingress. Moisture is likely to deteriorate the direct bonding interface, increase electromigration, and decrease performance of the IC package. The microelectronic assemblies and methods disclosed herein provide improved materials and structures to reduce moisture ingress and increase reliability.

FIG. 1 is a side, cross-sectional view of a microelectronic assembly 100 including a hermetic sealing structure, in accordance with various embodiments. The microelectronic assembly 100 may include an interposer 150 with an insulating material 106 having a first liner material 107-1 at a first surface 151-1, a second liner material 107-2 at an opposing second surface 151-2, and a perimeter wall 109 through the insulating material 106 and connected to the first and second liner materials 107-1, 107-2, a first microelectronic component 102-1 coupled via a first direct bonding (DB) region 130-1, and a second microelectronic component 102-2 coupled via a second DB region 130-2. The microelectronic assembly 100 may further include a mold material 126, a support component 182, an underfill material 138, and an encapsulation material 111. A number of elements are illustrated in FIG. 1 as included in the microelectronic assembly 100, but a number of these elements may not be present in a microelectronic assembly 100. For example, in various embodiments, the mold material 126, the encapsulation material 111, the second microelectronic component 102-2, the underfill material 138, and/or the support component 182 may not be included. Further, FIG. 1 illustrates a number of elements that are omitted from subsequent drawings for ease of illustration, but may be included in any of the microelectronic assemblies 100 disclosed herein. Examples of such elements include the mold material 126, the encapsulation material 111, the microelectronic components 102, the underfill material 138, and/or the support component 182. Many of the elements of the microelectronic assembly 100 of FIG. 1 are included in other ones of the accompanying drawings; the discussion of these elements is not repeated when discussing these drawings, and any of these elements may take any of the forms disclosed herein. In some embodiments, individual ones of the microelectronic assemblies 100 disclosed herein may serve as a system-in-package (SiP) in which multiple microelectronic components 102 having different functionality are included. In such embodiments, the microelectronic assembly 100 may be referred to as an SiP.

Figure 2:
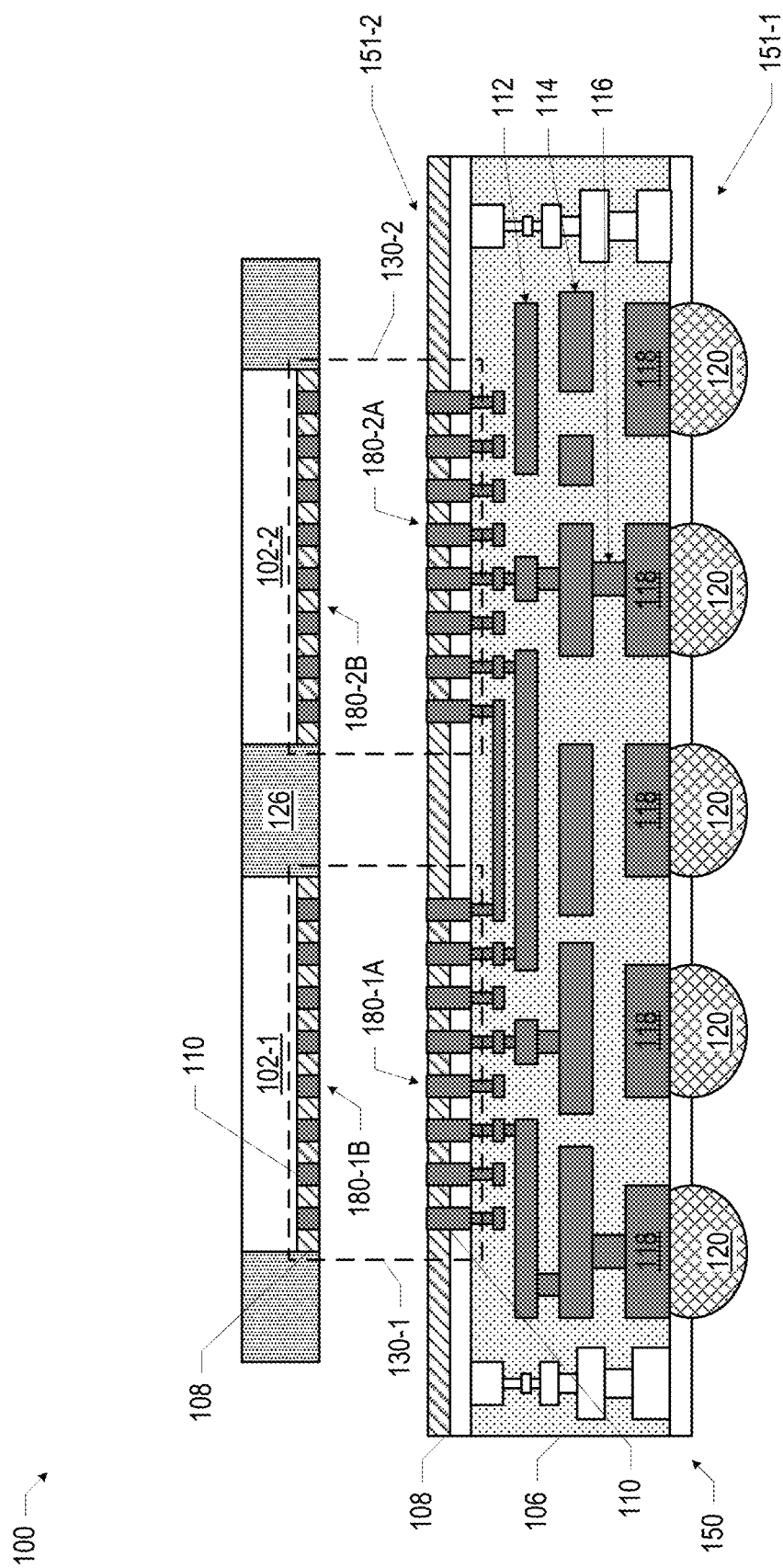
FIG. 2 is a side, cross-sectional exploded view of a portion of the microelectronic assembly of FIG. 1, in accordance with various embodiments.

The microelectronic assembly 100 may include an interposer 150 coupled to a microelectronic component 102-1 by a DB region 130-1. In particular, as illustrated in FIG. 2, the DB region 130-1 may include a DB interface 180-1A at the top surface of the interposer 150, with the DB interface 180-1A including a set of conductive DB contacts 110 and a DB dielectric 108 around the DB contacts 110 of the DB interface 180-1A. The DB region 130-1 may also include a DB interface 180-1B at the bottom surface of the microelectronic component 102-1, with the DB interface 180-1B including a set of DB contacts 110 and a DB dielectric 108 around the DB contacts 110 of the DB interface 180-1B. The DB contacts 110 of the DB interface 180-1A of the interposer 150 may align with the DB contacts 110 of the DB interface 180-1B of the microelectronic component 102-1 so that, in the microelectronic assembly 100, the DB contacts 110 of the microelectronic component 102-1 are in contact with the DB contacts 110 of the interposer 150. In the microelectronic assembly 100 of FIG. 1, the DB interface 180-1A of the interposer 150 may be bonded (e.g., electrically and mechanically) with the DB interface 180-1B of the microelectronic component 102-1 to form the DB region 130-1 coupling the interposer 150 and the microelectronic component 102-1, as discussed further below. More generally, the DB regions 130 disclosed herein may include two complementary DB interfaces 180 bonded together; for ease of illustration, many of the subsequent drawings may omit the identification of the DB interfaces 180 to improve the clarity of the drawings.

As used herein, the term "direct bonding" is used to include metal-to-metal bonding techniques (e.g., copper-to-copper bonding, or other techniques in which the DB contacts 110 of opposing DB interfaces 180 are brought into contact first, then subject to heat and/or compression) and hybrid bonding techniques (e.g., techniques in which the DB dielectric 108 of opposing DB interfaces 180 are brought into contact first, then subject to heat and sometimes compression, or techniques in which the DB contacts 110 and the DB dielectric 108 of opposing DB interfaces 180 are brought into contact substantially simultaneously, then subject to heat and compression). In such techniques, the DB contacts 110 and the DB dielectric 108 at one DB interface 180 are brought into contact with the DB contacts 110 and the DB dielectric 108 at another DB interface 180, respectively, and elevated pressures and/or temperatures may be applied to cause the contacting DB contacts 110 and/or the contacting DB dielectrics 108 to bond. In some embodiments, this bond may be achieved without the use of intervening solder or an anisotropic conductive material, while in some other embodiments, a thin cap of solder may be used in a DB interconnect to accommodate planarity, and this solder may become an intermetallic compound (IMC) in the DB region 130 during processing. DB interconnects may be capable of reliably conducting a higher current than other types of interconnects; for example, some conventional solder interconnects may form large volumes of brittle IMCs when current flows, and the maximum current provided through such interconnects may be constrained to mitigate mechanical and/or electro-migration failure. Although FIGS. 1 and 2 show the DB dielectric 108 as extending fully along the entire second surface 151-2 of the interposer 150, in some embodiments, the DB dielectric 108 may extend only along a portion of the second surface 151-2 of the interposer 150, such that a portion of the second liner material 107-2 is at the second surface 151-2 of the interposer 150.

A DB dielectric 108 may include one or more dielectric materials, such as one or more inorganic dielectric materials. For example, a DB dielectric 108 may include silicon and nitrogen (e.g., in the form of silicon nitride); silicon and oxygen (e.g., in the form of silicon oxide); silicon, carbon, and nitrogen (e.g., in the form of silicon carbonitride); carbon and oxygen (e.g., in the form of a carbon-doped oxide); silicon, oxygen, and nitrogen (e.g., in the form of silicon oxynitride); aluminum and oxygen (e.g., in the form of aluminum oxide); titanium and oxygen (e.g., in the form of titanium oxide); hafnium and oxygen (e.g., in the form of hafnium oxide); silicon, oxygen, carbon, and hydrogen (e.g., in the form of tetraethyl orthosilicate (TEOS)); zirconium and oxygen (e.g., in the form of zirconium oxide); niobium and oxygen (e.g., in the form of niobium oxide); tantalum and oxygen (e.g., in the form of tantalum oxide); and combinations thereof.

A DB contact 110 may include a pillar, a pad, or other structure. The DB contacts 110, although depicted in the accompanying drawings in the same manner at both DB interfaces 180 of a DB region 130, may have a same structure at both DB interfaces 180, or the DB contacts 110 at different DB interfaces 180 may have different structures. For example, in some embodiments, a DB contact 110 in one DB interface 180 may include a metal pillar (e.g., a copper pillar), and a complementary DB contact 110 in a complementary DB interface 180 may include a metal pad (e.g., a copper pad) recessed in a dielectric. A DB contact 110 may include any one or more conductive materials, such as copper, manganese, titanium, gold, silver, palladium, nickel, copper and aluminum (e.g., in the form of a copper aluminum alloy), tantalum (e.g., tantalum metal, or tantalum and nitrogen in the form of tantalum nitride), cobalt, cobalt and iron (e.g., in the form of a cobalt iron alloy), or any alloys of any of the foregoing (e.g., copper, manganese, and nickel in the form of manganin). In some embodiments, the DB dielectric 108 and the DB contacts 110 of a DB interface 180 may be manufactured using low-temperature deposition techniques (e.g., techniques in which deposition occurs at temperatures below 250 degrees Celsius, or below 200 degrees Celsius), such as low-temperature plasma-enhanced chemical vapor deposition (PECVD).

FIGS. 1 and 2 also illustrate a microelectronic component 102-2 coupled to the interposer 150 by a DB region 130-2 (via the DB interfaces 180-2A and 180-2B, as shown in FIG. 2). Although FIG. 1 depicts a particular number of microelectronic components 102 coupled to the interposer 150 by DB regions 130, this number and arrangement are simply illustrative, and a microelectronic assembly 100 may include any desired number and arrangement of microelectronic components 102 coupled to an interposer 150 by DB regions 130. Although a single reference numeral "108" is used to refer to the DB dielectrics of multiple different DB interfaces 180 (and different DB regions 130), this is simply for ease of illustration, and the DB dielectric 108 of different DB interfaces 180 (even within a single DB region 130) may have different materials and/or structures (e.g., in accordance with any of the embodiments discussed below with reference to FIG. 3). Similarly, although a single reference numeral "110" is used to refer to the DB contacts of multiple different DB interfaces 180 (and different DB regions 130), this is simply for ease of illustration, and the DB contacts 110 of different DB interfaces 180 (even within a single DB region 130) may have different materials and/or structures.

The interposer 150 may include an insulating material 106 (e.g., one or more dielectric materials formed in multiple layers, as known in the art), a first liner material 107-1 on a first surface 151-1 (e.g., on the bottom surface), a second liner material 107-2 on a second surface 151-2 (e.g., on a top surface), and a perimeter wall 109 through the insulating material 106 along an outer edge (e.g., disposed along a perimeter) of the interposer and connected to the first and second liner materials 107-1, 107-2 forming a hermetic seal or diffusion barrier that encapsulates an inner portion of the interposer 150. As used herein, the terms "liner material," "barrier layer," "surface sealant," and variations thereof, may be used interchangeably. As used herein, the terms "edge ring," "perimeter wall," "through-interposer lateral barrier," and variations thereof, may be used interchangeably. The liner material 107 may have any suitable dimensions and be made of any suitable material. In some embodiments, the liner material 107 may have a thickness between 100 nanometers and 20 microns. In some embodiments, the first and second liner materials 107-1, 107-2 may have a thickness between 100 nanometers and 10 microns. In some embodiments, the first liner material 107-1 may have a thickness between 100 nanometers and 20 microns and the second liner material may have a thickness between 100 nanometers and 10 microns (e.g., as described below with reference to FIG. 3A). In some embodiments, the first liner material 107-1 may have a thickness between 100 nanometers and 10 microns and the second liner material may have a thickness between 100 nanometers and 20 microns (e.g., as described below with reference to FIG. 4D). In some embodiments, the liner material 107 may include silicon and nitrogen (e.g., in the form of silicon nitride), silicon, carbon, and nitrogen (e.g., in the form of silicon carbonitride), silicon, oxygen, carbon, and nitrogen (e.g., in the form of silicon oxycarbonitride), silicon and carbon (e.g., in the form of silicon carbide), aluminum and oxygen (e.g., in the form of aluminum oxide), aluminum and nitrogen (e.g., in the form of aluminum nitride), or aluminum, oxygen, and nitrogen (e.g., in the form of aluminum oxynitride). In some embodiments, the first liner material 107-1 and the second liner material 107-2 are a same material. In some embodiments, the first liner material 107-1 and the second liner material 107-2 are a different material.

The perimeter wall 109 may have any suitable dimensions and be made of any suitable material. In some embodiments, the perimeter wall 109 has a width (e.g., x-dimension) between 25 nanometers and 25 microns, and a thickness (e.g., z-dimension) between 1 micron and 50 microns. In some embodiments, the perimeter wall 109 may include a same material as the one or more conductive pathways 112, for example, the perimeter wall 109 may include a conductive material, such as copper, silver, nickel, gold, aluminum, other metals or alloys, or combinations thereof. In some embodiments, a material of the perimeter wall 109 may include silicon and nitrogen (e.g., in the form of silicon nitride), silicon, carbon, and nitrogen (e.g., in the form of silicon carbonitride), silicon, oxygen, carbon, and nitrogen (e.g., in the form of silicon oxycarbonitride), silicon and carbon (e.g., in the form of silicon carbide) aluminum and oxygen (e.g., in the form of aluminum oxide), aluminum and nitrogen (e.g., in the form of aluminum nitride), or aluminum, oxygen, and nitrogen (e.g., in the form of aluminum oxynitride). In some embodiments, the perimeter wall 109 material and the liner material 107 are a same material. In some embodiments, the perimeter wall 109 material and the liner material 107 are a different material. In some embodiments, the first liner material 107-1, the second liner material 107-2, and the perimeter wall 109 material are different materials.

The interposer 150 may include one or more conductive pathways 112 through the insulating material 106 (e.g., including conductive lines 114 and/or conductive vias 116, as shown). In some embodiments, the insulating material 106 of the interposer 150 includes an inorganic dielectric material, such as silicon and nitrogen (e.g., in the form of silicon nitride); silicon and oxygen (e.g., in the form of silicon oxide); silicon and carbon (e.g., in the form of silicon carbide); silicon, carbon, and oxygen (e.g., in the form of silicon oxycarbide); silicon, carbon, and nitrogen (e.g., in the form of silicon carbonitride); carbon and oxygen (e.g., in the form of a carbon-doped oxide); silicon, oxygen, and nitrogen (e.g., in the form of silicon oxynitride); or silicon, oxygen, carbon, and hydrogen (e.g., in the form of tetraethyl orthosilicate (TEOS)); and combinations thereof. In some embodiments, the insulating material 106 of the interposer 150 includes an insulating metal oxide, such as aluminum and oxygen (e.g., in the form of aluminum oxide); titanium and oxygen (e.g., in the form of titanium oxide); hafnium and oxygen (e.g., in the form of hafnium oxide); zirconium and oxygen (e.g., in the form of zirconium oxide); niobium and oxygen (e.g., in the form of niobium oxide); or tantalum and oxygen (e.g., in the form of tantalum oxide); and combinations thereof. In some embodiments, the interposer 150 may be semiconductor-based (e.g., silicon-based) or glass-based. In some embodiments, the interposer 150 is a silicon wafer or die. In some embodiments, the interposer 150 may be a silicon-on-insulator (SOI) and may further include layers of silicon and germanium (e.g., in the form of silicon germanium), gallium and nitrogen (e.g., in the form of gallium nitride), indium and phosphorous (e.g., in the form of indium phosphide), among others. In some embodiments, the insulating material 106 of the interposer 150 may be an organic material, such as polyimide or polybenzoxazole, or may include an organic polymer matrix (e.g., epoxide) with a filler material (which may be inorganic, such as silicon nitride, silicon oxide, or aluminum oxide). In some such embodiments, the interposer 150 may be referred to as an "organic interposer." In some embodiments, the insulating material 106 of an interposer 150 may be provided in multiple layers of organic buildup film. Organic interposers 150 may be less expensive to manufacture than semiconductor- or glass-based interposers, and may have electrical performance advantages due to the low dielectric constants of organic insulating materials 106 and the thicker lines that may be used (allowing for improved power delivery, signaling, and potential thermal benefits). Organic interposers 150 may also have larger footprints than can be achieved for semiconductor-based interposers, which are limited by the size of the reticle used for patterning. Further, organic interposers 150 may be subject to less restrictive design rules than those that constrain semiconductor- or glass-based interposers, allowing for the use of design features such as non-Manhattan routing (e.g., not being restricted to using one layer for horizontal interconnects and another layer for vertical interconnects) and the avoidance of through-substrate vias (TSVs) such as through-silicon vias or through-glass vias (which may be limited in the achievable pitch, and may result in less desirable power delivery and signaling performance). Conventional integrated circuit packages including an organic interposer have been limited to solder-based attach technologies, which may have a lower limit on the achievable pitch that precludes the use of conventional solder-based interconnects to achieve the fine pitches desired for next generation devices. Utilizing an organic interposer 150 in a microelectronic assembly 100 with direct bonding, as disclosed herein, may leverage these advantages of organic interposers in combination with the ultra-fine pitch (e.g., the pitch 128 discussed below) achievable by direct bonding (and previously only achievable when using semiconductor-based interposers), and thus may support the design and fabrication of large and sophisticated die complexes that can achieve packaged system competition performance and capabilities not enabled by conventional approaches.

In other embodiments, the insulating material 106 of the interposer 150 may include a fire retardant grade 4 material (FR-4), bismaleimide triazine (BT) resin, or low-k or ultra low-k dielectric (e.g., carbon-doped dielectrics, fluorine-doped dielectrics, and porous dielectrics). When the interposer 150 is formed using standard printed circuit board (PCB) processes, the insulating material 106 may include FR-4, and the conductive pathways 112 in the interposer 150 may be formed by patterned sheets of copper separated by buildup layers of the FR-4. In some such embodiments, the interposer 150 may be referred to as a "package substrate" or a "circuit board."

In some embodiments, one or more of the conductive pathways 112 in the interposer 150 may extend between a conductive contact at the top surface of the interposer 150 (e.g., one of the DB contacts 110) and a conductive contact 118 at the bottom surface of the interposer 150. In some embodiments, one or more of the conductive pathways 112 in the interposer 150 may extend between different conductive contacts at the top surface of the interposer 150 (e.g., between different DB contacts 110 potentially in different DB regions 130). In some embodiments, one or more of the conductive pathways 112 in the interposer 150 may extend between different conductive contacts 118 at the bottom surface of the interposer 150.

In some embodiments, an interposer 150 may only include conductive pathways 112, and may not contain active or passive circuitry. In other embodiments, an interposer 150 may include active or passive circuitry (e.g., transistors, diodes, resistors, inductors, and capacitors, among others). In some embodiments, an interposer 150 may include one or more device layers including transistors.

Although FIGS. 1 and 2 (and others of the accompanying drawings) illustrate a specific number and arrangement of conductive pathways 112 in the interposer 150, these are simply illustrative, and any suitable number and arrangement may be used. The conductive pathways 112 disclosed herein (e.g., including lines 114 and/or vias 116) may be formed of any appropriate conductive material, such as copper, silver, nickel, gold, aluminum, other metals or alloys, or combinations of materials, for example.

In some embodiments, a microelectronic component 102 may include an IC die (packaged or unpackaged) or a stack of an IC dies (e.g., a high-bandwidth memory dies stack). In some such embodiments, the insulating material of a microelectronic component 102 may include silicon dioxide, silicon nitride, oxynitride, polyimide materials, glass-reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some further embodiments, the insulating material of a microelectronic component 102 may include a semiconductor material, such as silicon, germanium, or a III-V material (e.g., gallium nitride), and one or more additional materials. For example, an insulating material of a microelectronic component 102 may include silicon oxide or silicon nitride. The conductive pathways in a microelectronic component 102 may include conductive lines and/or conductive vias, and may connect any of the conductive contacts in the microelectronic component 102 in any suitable manner (e.g., connecting multiple conductive contacts on a same surface or on different surfaces of the microelectronic component 102). Example structures that may be included in the microelectronic components 102 disclosed herein are discussed below with reference to FIG. 11. In particular, a microelectronic component 102 may include active and/or passive circuitry (e.g., transistors, diodes, resistors, inductors, and capacitors, among others). In some embodiments, a microelectronic component 102 may include one or more device layers including transistors. When a microelectronic component 102 includes active circuitry, power and/or ground signals may be routed through the interposer 150 and to/from a microelectronic component 102 through a DB region 130. In some embodiments, a microelectronic component 102 may take the form of any of the embodiments of the interposer 150 herein. Although the microelectronic components 102 of the microelectronic assembly 100 of FIG. 1 are single-sided components (in the sense that an individual microelectronic component 102 only has conductive contacts (e.g., DB contacts 110) on a single surface of the individual microelectronic component 102), in some embodiments, a microelectronic component 102 may be a double-sided (or "multi-level," or "omni-directional") component with conductive contacts on multiple surfaces of the component. A particular example of a double-sided microelectronic component 102 is discussed below with reference to FIG. 7A.

Additional components (not shown), such as surface-mount resistors, capacitors, and/or inductors, may be disposed on the top surface or the bottom surface of the interposer 150, or embedded in the interposer 150. The microelectronic assembly 100 of FIG. 1 also includes a support component 182 coupled to the interposer 150. In the particular embodiment of FIG. 1, the support component 182 includes conductive contacts 118 that are electrically coupled to complementary conductive contacts 118 of the interposer 150 by intervening solder 120 (e.g., solder balls in a ball grid array (BGA) arrangement), but any suitable interconnect structures may be used (e.g., pins in a pin grid array arrangement, lands in a land grid array arrangement, pillars, pads and pillars, etc.). The solder 120 utilized in the microelectronic assemblies 100 disclosed herein may include any suitable materials, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, the couplings between the interposer 150 and the support component 182 may be referred to as second-level interconnects (SLI) or multi-level interconnects (MLI).

In some embodiments, the support component 182 may be a package substrate (e.g., may be manufactured using PCB processes, as discussed above). In some embodiments, the support component 182 may be a circuit board (e.g., a motherboard), and may have other components attached to it (not shown). The support component 182 may include conductive pathways and other conductive contacts (not shown) for routing power, ground, and signals through the support component 182, as known in the art. In some embodiments, the support component 182 may include another IC package, an interposer, or any other suitable component. An underfill material 138 may be disposed around the solder 120 coupling the interposer 150 to the support component 182. In some embodiments, the underfill material 138 may include an epoxy material.

In some embodiments, the support component 182 may be a lower density component, while the interposer 150 and/or the microelectronic components 102 may be higher density components. As used herein, the term "lower density" and "higher density" are relative terms indicating that the conductive pathways (e.g., including conductive lines and conductive vias) in a lower density component are larger and/or have a greater pitch than the conductive pathways in a higher density component. In some embodiments, a microelectronic component 102 may be a higher density component, and an interposer 150 may be a lower density component. In some embodiments, a higher density component may be manufactured using a dual damascene or single damascene process (e.g., when the higher density component is a die), while a lower density component may be manufactured using a semi-additive or modified semi-additive process (with small vertical interconnect features formed by advanced laser or lithography processes) (e.g., when the lower density component is a package substrate or an interposer). In some other embodiments, a higher density component may be manufactured using a semi-additive or modified semi-additive process (e.g., when the higher density component is a package substrate or an interposer), while a lower density component may be manufactured using a semi-additive or a subtractive process (using etch chemistry to remove areas of unwanted metal, and with coarse vertical interconnect features formed by a standard laser process) (e.g., when the lower density component is a PCB).

The microelectronic assembly 100 of FIG. 1 may also include a mold material 126. The mold material 126 may extend around one or more of the microelectronic components 102 on the interposer 150. In some embodiments, the mold material 126 may extend between multiple microelectronic components 102 on the interposer 150 and around the DB regions 130. In some embodiments, the mold material 126 may extend above one or more of the microelectronic components 102 on an interposer 150 (not shown). The mold material 126 may be an insulating material, such as an appropriate epoxy material. The mold material 126 may be selected to have a coefficient of thermal expansion (CTE) that may mitigate or minimize the stress between the microelectronic components 102 and the interposer 150 arising from uneven thermal expansion in the microelectronic assembly 100. In some embodiments, the CTE of the mold material 126 may have a value that is intermediate to the CTE of the interposer 150 (e.g., the CTE of the insulating material 106 of the interposer 150) and a CTE of the microelectronic components 102. In some embodiments, the mold material 126 used in a microelectronic assembly 100 may be selected at least in part for its thermal properties. For example, one or more mold materials 126 used in a microelectronic assembly 100 may have low thermal conductivity (e.g., conventional mold compounds) to retard heat transfer, or may have high thermal conductivity (e.g., mold materials including metal or ceramic particles with high thermal conductivity, such as copper, silver, diamond, silicon carbide, aluminum nitride, and boron nitride, among others) to facilitate heat transfer. Any of the mold materials 126 referred to herein may include one or more different materials with different material compositions.

The microelectronic assembly 100 of FIG. 1 may further include an encapsulation material 111 on the microelectronic components 102 and the mold material 126, surrounding the interposer 150, and extending to the first liner material 107-1. In some embodiments, the encapsulation material 111 is connected to the first liner material 107-1, as shown in FIG. 1. In some embodiments, the encapsulation material 111 is connected to the underfill material 138 (e.g., extends beyond to surround and encapsulate the first liner material 107-1)(not shown). The encapsulation material 111 may include copper, aluminum, silver, diamond, graphene, ceramic, silicon and carbon, boron and nitrogen, or aluminum and nitrogen. The encapsulation material 111 may be deposited using any suitable technique, including an additive manufacturing method, such as coldspray. In some embodiments, the encapsulation material 111 may be deposited as the final process in the manufacture of the microelectronic assembly 100. In some embodiments, the microelectronic assembly 100 may include the encapsulation material 111 and may not include the second liner material 107-2 and/or the perimeter wall 109.

The microelectronic assembly 100 of FIG. 1 may also include a thermal interface material (TIM) (not shown). The TIM may include a thermally conductive material (e.g., metal particles) in a polymer or other binder. The TIM may be a thermal interface material paste or a thermally conductive epoxy (which may be a fluid when applied and may harden upon curing, as known in the art). The TIM may provide a path for heat generated by the microelectronic components 102 to readily flow to a heat transfer structure, where it may be spread and/or dissipated. Some embodiments of the microelectronic assembly 100 of FIG. 1 may include a sputtered metallization (not shown) across the top surfaces of the mold material 126 and the microelectronic components 102; the TIM (e.g., a solder TIM) may be disposed on this metallization.

The microelectronic assembly 100 of FIG. 1 may also include a heat transfer structure (not shown). The heat transfer structure may be used to move heat away from one or more of the microelectronic components 102 (e.g., so that the heat may be more readily dissipated). The heat transfer structure may include any suitable thermally conductive material (e.g., metal, appropriate ceramics, etc.), and may include any suitable features (e.g., a heat spreader, a heat sink including fins, a cold plate, etc.). In some embodiments, a heat transfer structure may be or may include an integrated heat spreader (IHS).

The elements of a microelectronic assembly 100 may have any suitable dimensions. Only a subset of the accompanying drawings are labeled with reference numerals representing dimensions, but this is simply for clarity of illustration, and any of the microelectronic assemblies 100 disclosed herein may have components having the dimensions discussed herein. In some embodiments, the thickness 184 of the interposer 150 may be between 20 microns and 200 microns. In some embodiments, the thickness 188 of a DB region 130 may be between 50 nanometers and 5 microns. In some embodiments, a thickness 190 of a microelectronic component 102 may be between 5 microns and 800 microns. In some embodiments, a pitch 128 of the DB contacts 110 in a DB region 130 may be less than 20 microns (e.g., between 0.1 microns and 20 microns).

Figure 3A:
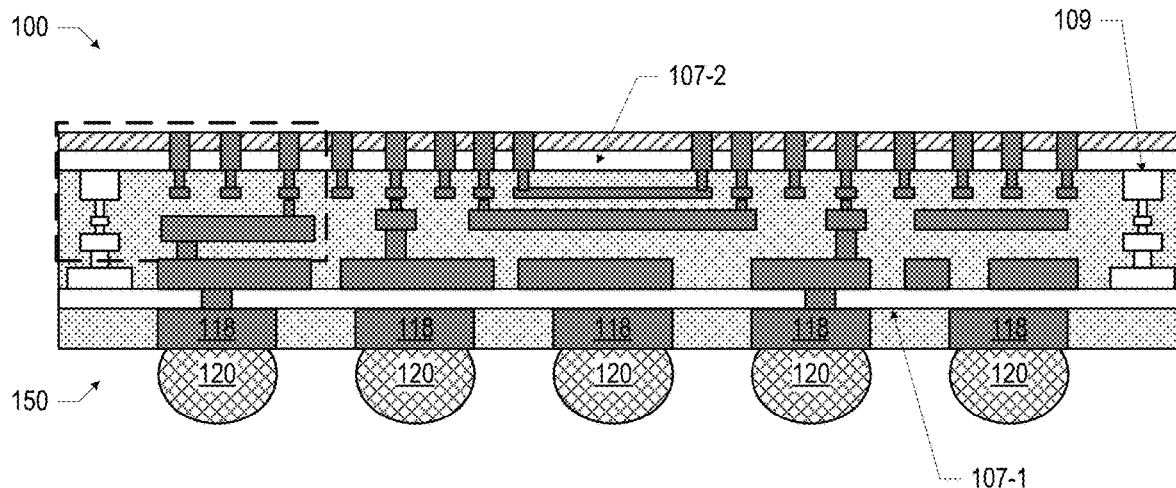
FIGS. 3A-3C are side, cross-sectional views of various example microelectronic assemblies including hermetic sealing structures, in accordance with various embodiments.
Figure 3B:
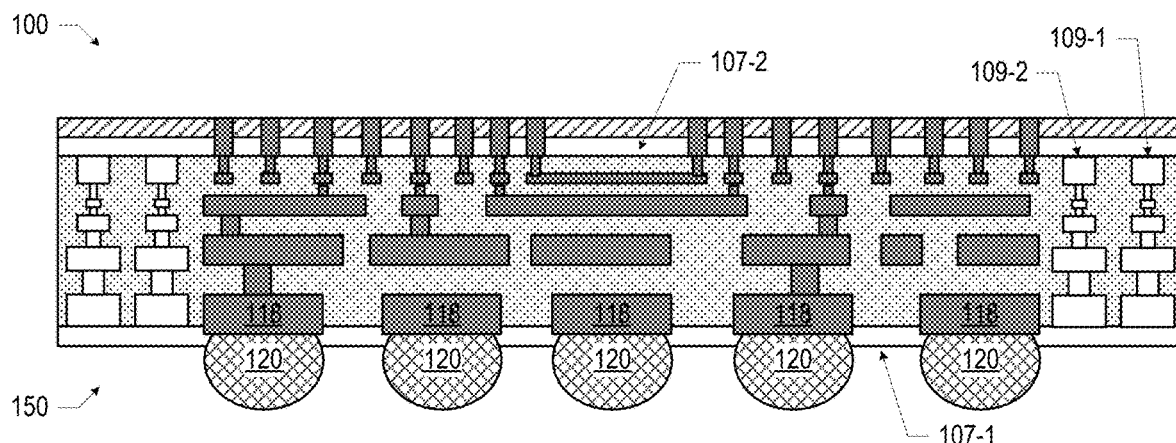
Figure 3C:
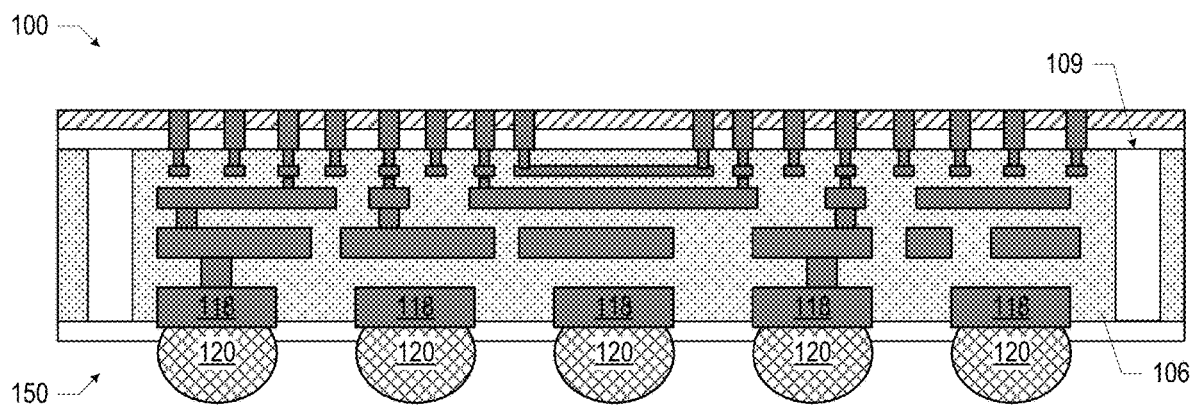

FIGS. 3A-3C are side, cross-sectional views of various example microelectronic assemblies including hermetic sealing structures, in accordance with various embodiments. FIG. 3A illustrates a microelectronic assembly 100 including a first liner material 107-1 that is a layer within the interposer 150 (e.g., is not at the first surface 151-1 of the interposer 150). Although FIG. 3A shows the first liner material 107-1 disposed at a particular layer within the interposer 150, the first liner material 107-1 may be at any layer within the interposer 150. In some embodiments, the first liner material 107-1 may include multiple layers within the interposer 150 and may further include multiple layers at the first surface 151-1 of the interposer 150 (not shown).

A microelectronic assembly 100 may include one or more perimeter walls 109. FIG. 3B illustrates a microelectronic assembly 100 having a first perimeter wall 109-1 and a second perimeter wall 109-2 that are concentric, where the first perimeter wall 109-1 is nearer to an outer edge of the interposer 150 and the second perimeter wall 109-2 is adjacent to the first perimeter wall 109-1 and the first perimeter wall 109-1 is between the second perimeter wall 109-2 and the outer edge of the interposer 150.

FIG. 3C illustrates a microelectronic assembly 100 including an perimeter wall 109 that is formed subsequent to the formation of the interposer 150, for example, by forming a cavity in the insulating material 106 (e.g., by laser drilling) and filling the cavity with a conductive material or a hermeticity providing dielectric material. Although FIG. 3C depicts a single perimeter wall 109, additional perimeter walls 109 may be formed using similar techniques.

Figure 4A:
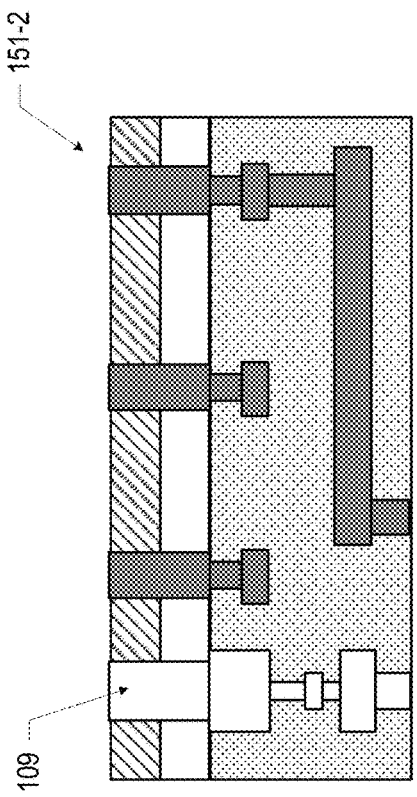
FIGS. 4A-4D are side, cross-sectional magnified views of the dotted-line portion of FIG. 3A illustrating example bonding interfaces, in accordance with various embodiments.
Figure 4B:
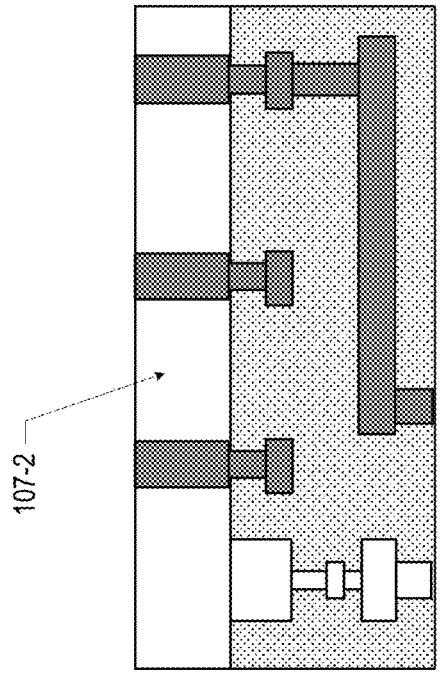
Figure 4C:
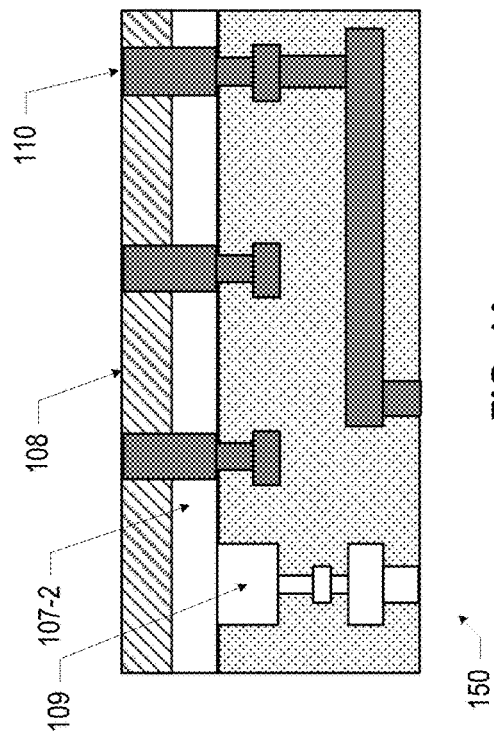
Figure 4D:
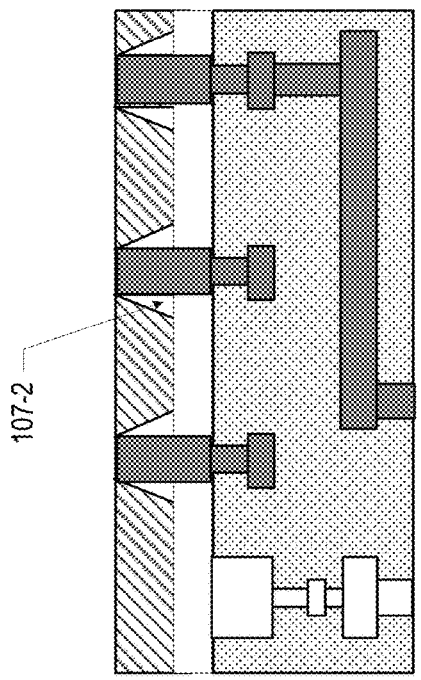

FIGS. 4A-4D are side, cross-sectional magnified views of the dotted-line portion of FIG. 3A illustrating example bonding interfaces between an perimeter wall 109, the second liner material 107-2, the DB dielectric 108, and the DB contacts 110 in an interposer 150, in accordance with various embodiments. FIG. 4A illustrates a portion of an interface where a top surface of a perimeter wall 109 is flush and connected (e.g., forms a hermetic seal) with a bottom surface of a second liner material 107-2. FIG. 4B illustrates a portion of an interface where a perimeter wall 109 extends through the second liner material 107-2 and the DB dielectric 108 and is flush with the DB contacts 110 at the second surface 151-2 of the interposer 150. FIG. 4C illustrates a portion of an interface where a second liner material 107-2 is provided around the DB contacts 110 and extends along at least a portion of the DB contacts 110, and a DB dielectric 108 is disposed on the second liner material 107-2. FIG. 4D illustrates a portion of an interface where a second liner material 107-2 at the second surface 151-2 of the interposer 150 that functions as a hermetic seal and as a DB dielectric bonding interface. In such embodiment, the second liner material 107-2 may have a thickness between 100 nanometers and 20 microns.

Figure 5A:
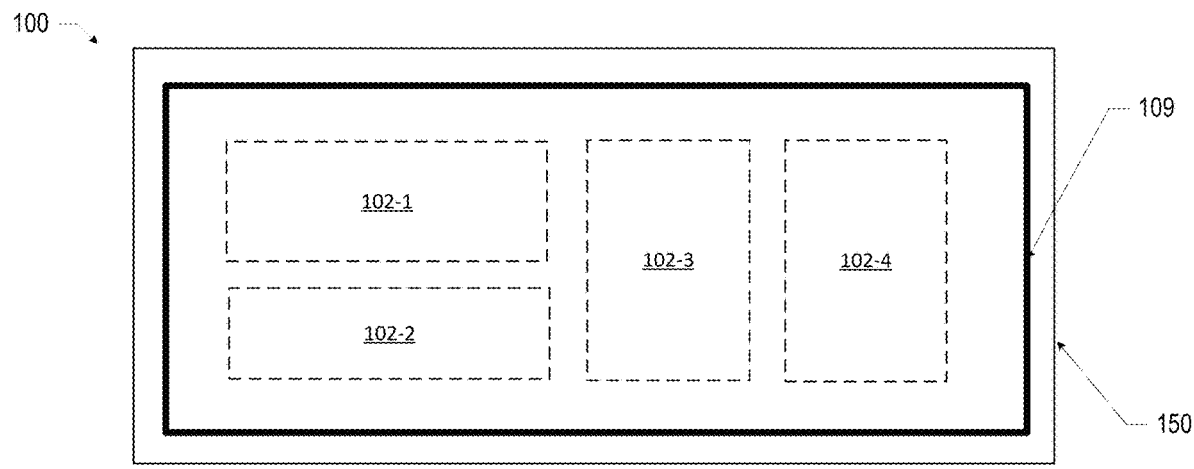
FIGS. 5A-5C are top view schematics of example microelectronic assemblies including hermetic sealing structures, in accordance with various embodiments.
Figure 5B:
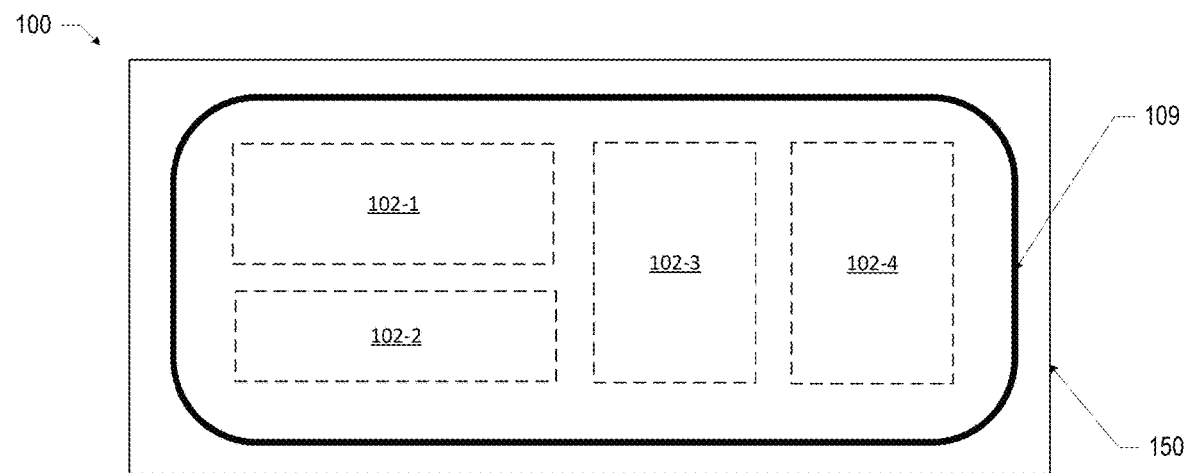
Figure 5C:
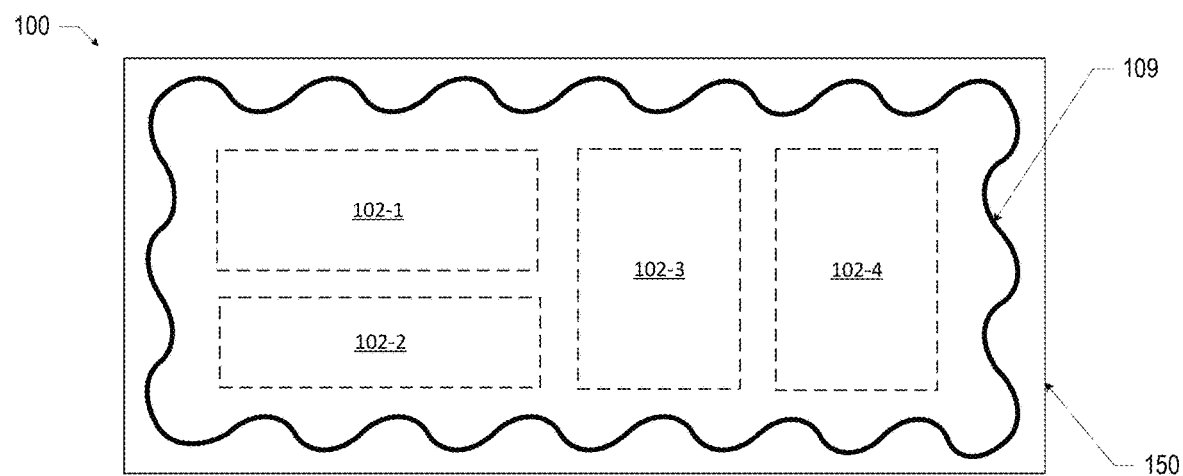

FIGS. 5A-5C are top view schematics of example microelectronic assemblies including hermetic sealing structures, in accordance with various embodiments. FIG. 5A illustrates a perimeter wall 109 along a perimeter of an interposer 150 and having squared corners. FIG. 5B illustrates a perimeter wall 109 along a perimeter of an interposer 150 and having rounded corners, which may prevent cracking of the components (e.g., microelectronic components 102), connections (e.g., DB regions 130), and/or the perimeter wall 109 on the interposer 150 by reducing high stress points and tensile strain on the perimeter wall. FIG. 5C illustrates a perimeter wall 109 along a perimeter of an interposer 150 having non-linear (e.g., a meandering or wavy) form and rounded corners to further prevent cracking of the perimeter wall. In some embodiments, the non-linear perimeter wall may be able to accommodate periodical changes of up to 10 percent (%) in elongation. Although FIG. 5 illustrate a single perimeter wall 109, a microelectronic assembly 100 may include more than one perimeter wall 109, for example, in some embodiments, a plurality of perimeter walls may be concentric.

The microelectronic assemblies 100 disclosed herein, may be manufactured in any suitable manner. For example, FIGS. 6A-6E are side, cross-sectional views of example stages in the manufacture of a portion of the microelectronic assembly 100 of FIGS. 1 and 2, in accordance with various embodiments. Although the operations discussed with reference to FIGS. 6A-6E may be illustrated with reference to particular embodiments of the microelectronic assemblies 100 disclosed herein, the manufacturing methods discussed with reference to FIGS. 6A-6E may be used to form any suitable microelectronic assemblies 100 operations are illustrated once each and in a particular order in FIGS. 6A-6E, but the operations may be reordered and/or repeated as desired (e.g., with different operations performed in parallel when manufacturing multiple microelectronic assemblies 100 simultaneously). However, any suitable manufacturing processes may be used to manufacture any of the microelectronic assemblies 100 disclosed herein.

FIG. 6A illustrates a first liner material 107-1 deposited on a carrier 104. The carrier 104 may include any suitable material, and in some embodiments, may include a semiconductor wafer (e.g., a silicon wafer) or glass (e.g., a glass panel). The first liner material 107-1 may be deposited using any suitable technique, for example, chemical vapor deposition (CVD), atomic layer deposition (ALD), plasma-enhanced chemical vapor deposition (PECVD), or spin coating.

FIG. 6B illustrates an assembly subsequent to forming an interposer 150 on the first liner material 107-1 and depositing a second liner material 107-2 on the interposer 150. The interposer 150 further includes a perimeter wall 109 adjacent to the outer edge (e.g., perimeter) of the interposer 150. The perimeter wall 109 is connected to (e.g., forms a seal with) the first liner material 107-1 at the first surface 151-1 of the interposer 150 and is connected to (e.g., forms a seal with) the second liner material 107-2 at the second surface 151-2 of the interposer 150. When the interposer 150 is an organic interposer, the interposer 150 may be advantageously manufactured on the first liner material 107-1/carrier 104, which may provide a mechanically stable surface on which the layers of the interposer 150 may be formed. In some embodiments, the perimeter wall 109 may be formed layer-by-layer as each layer of the interposer 150 is formed. In some embodiments, the perimeter wall 109 may be formed after the interposer 150 is formed (e.g., similar to a TSV structure having linear sidewalls and a cross-section with any suitable shape), for example, by forming a trench or cavity using laser drilling or reactive ion etching (RIE), and subsequently filling the trench with a conductive material or a hermeticity providing dielectric material, such as silicon and nitrogen.

FIG. 6C illustrates an assembly subsequent to forming DB interfaces 180-1 and 180-2, for example, by depositing a DB dielectric 108, and patterning and filling cavities with conductive material, such as copper, to form DB contacts 110.

Figure 6D:
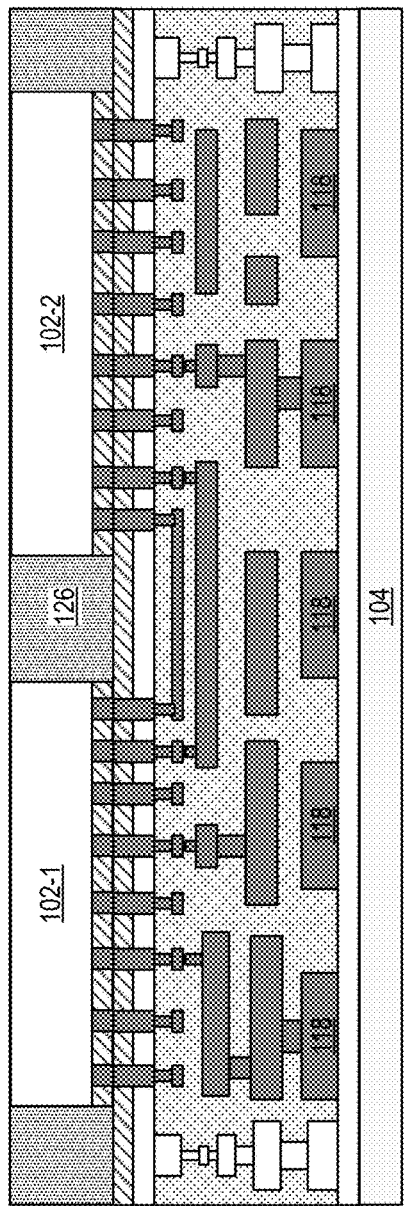

FIG. 6D illustrates an assembly subsequent to direct bonding microelectronic components 102-1 and 102-2 and providing a mold material 126 around the microelectronic components 102 and on the surface of the interposer 150 of the assembly of FIG. 6C. In particular, DB interfaces 180 (not labeled) of the microelectronic components 102 may be brought into contact with the DB interfaces 180 of the interposer 150, and heat and/or pressure to be applied to bond the contacting DB interfaces 180 to form DB regions 130 (with DB regions 130-1 and 130-2 corresponding to the DB interfaces 180-1 and 180-2, respectively). The mold material 126 may be deposited using any suitable technique, including, for example, a PECVD process or a spin coat and subsequent thermal anneal process. In some embodiments, the mold material 126 may extend above and remain above the microelectronic components 102, while in other embodiments, the mold material 126 may be polished back to expose the top surfaces of the microelectronic components 102, as shown. In some embodiments, the mold material 126 may be planarized, for example, using CMP.

Figure 6E:
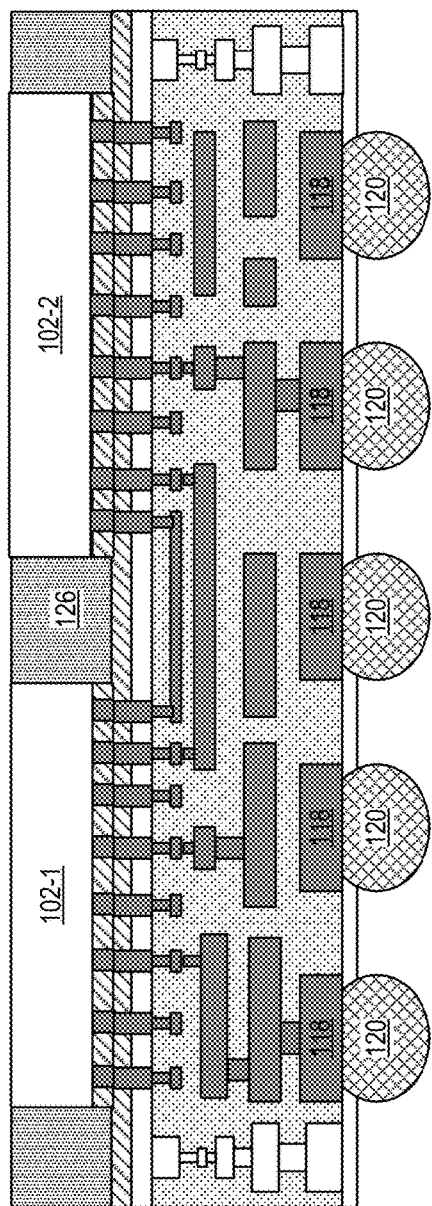

FIG. 6E illustrates an assembly subsequent to removing the carrier 104 from the assembly of FIG. 6D, and providing solder 120 on the newly exposed conductive contacts 118. The assembly of FIG. 6E may itself be a microelectronic assembly 100, as shown. Further manufacturing operations may be performed on the microelectronic assembly 100 of FIG. 6E to form other microelectronic assemblies 100; for example, the solder 120 may be used to couple the microelectronic assembly 100 of FIG. 6E to a support component 182, an underfill material 138 around the solder 120, and an encapsulation material 111 may be provided on the top surface and the sides of the microelectronic assembly 100 of FIG. 6E, forming the microelectronic assembly 100 of FIG. 1.

Figure 7A:
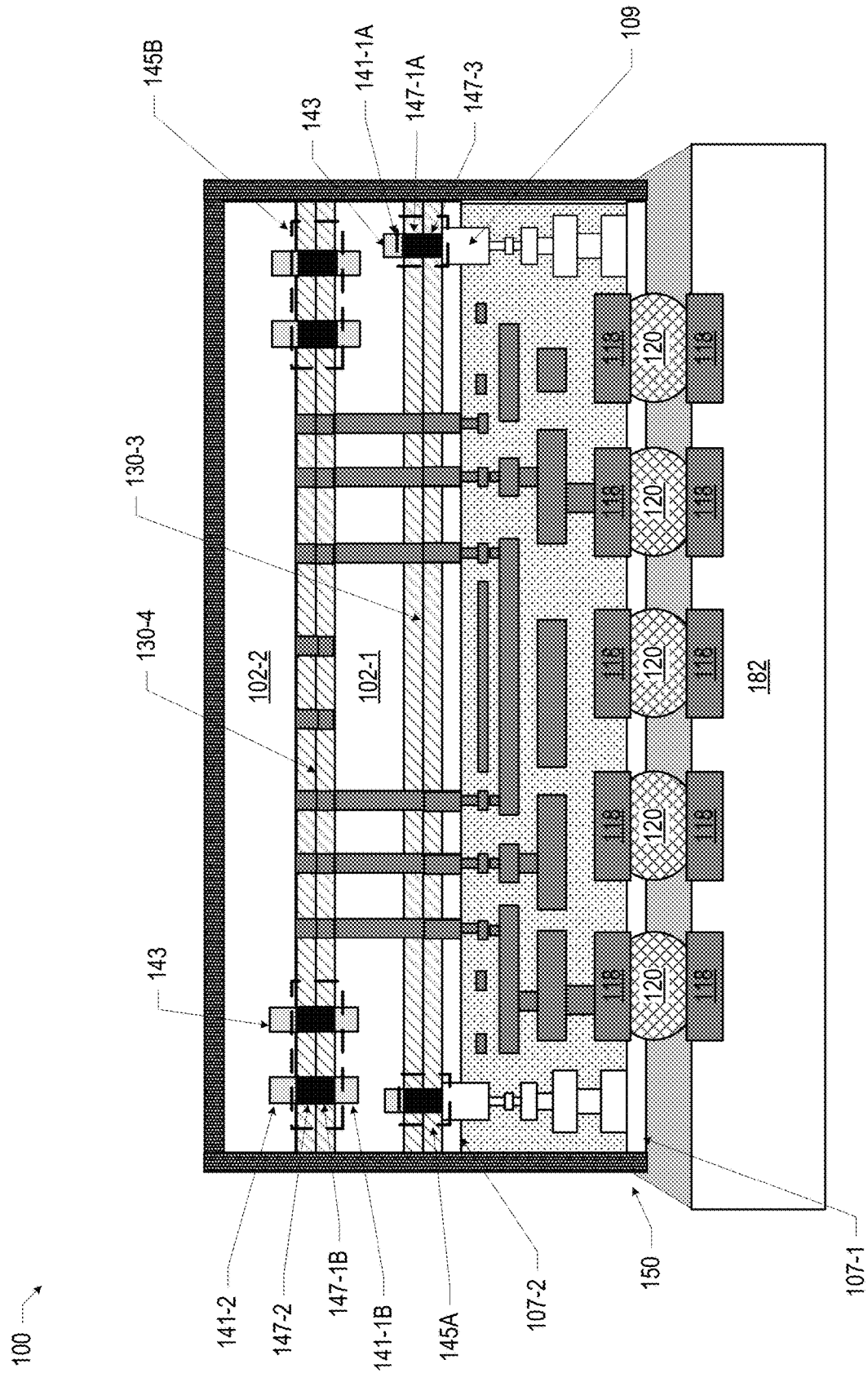
FIGS. 7A-7B are side, cross-sectional views of example microelectronic assemblies including hermetic sealing structures, in accordance with various embodiments.
Figure 7B:
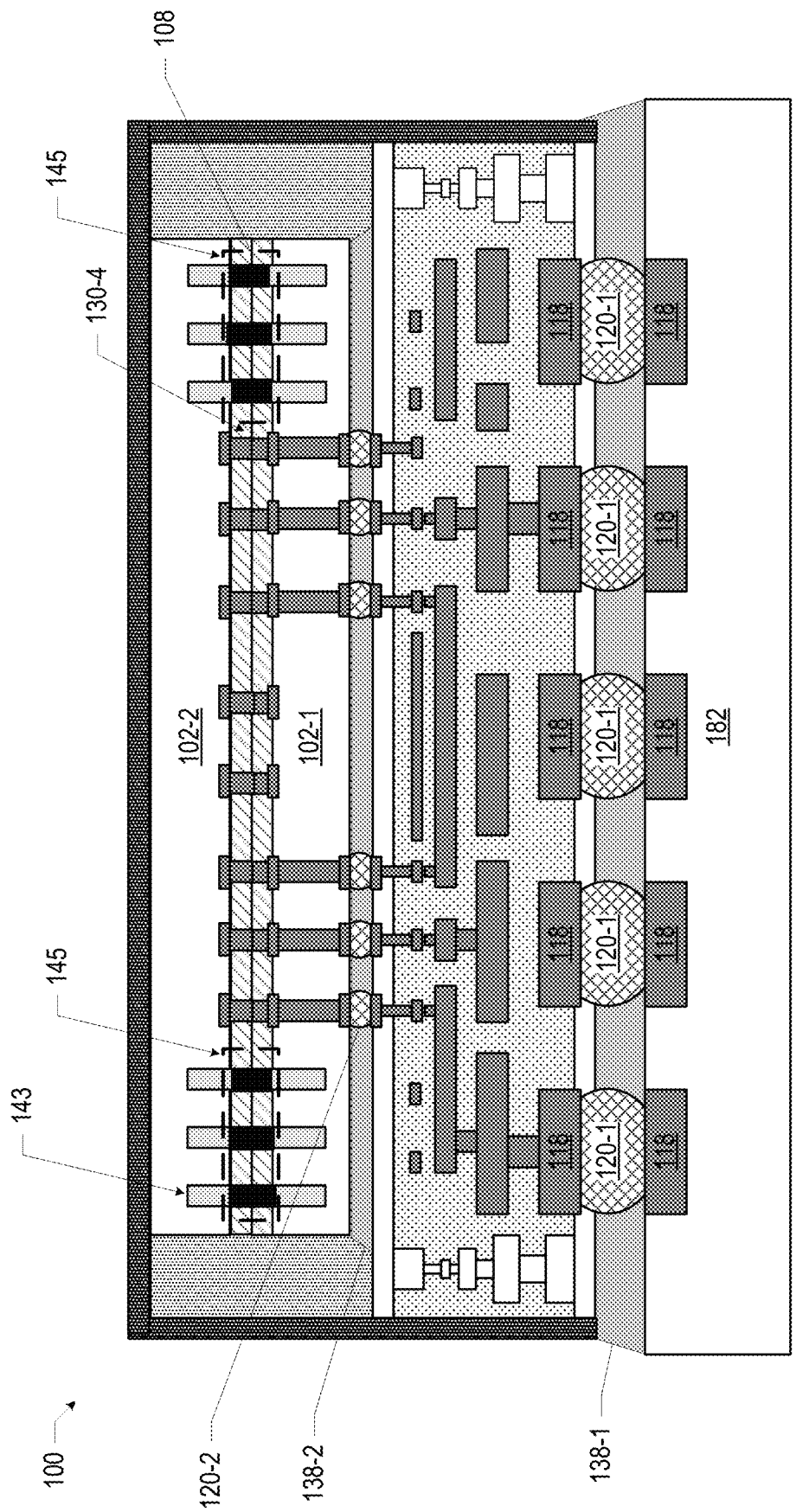

FIGS. 7A-7B are side, cross-sectional views of example microelectronic assemblies including multiple "tiers" of microelectronic components 102 coupled by at least one DB region 130 and a hermetic seal ring region 145, in accordance with various embodiments. FIG. 7A illustrates a microelectronic assembly 100 including a first microelectronic component 102-1 coupled to an interposer 150 via a DB region 130-3 and via a hermetic seal ring region 145A, and coupled to a second microelectronic component 102-2 via a DB region 130-4 and via a hermetic seal ring region 145B. The hermetic seal ring region 145 may include one or more seal rings 143 around the DB region 130. In some embodiments, a seal ring 143 may be formed by coupling via direct bonding a guard ring 141 to another guard ring 141 (e.g., as shown in hermetic seal ring region 145B where guard ring 141-1B is coupled to guard ring 141-2 via respective surface contacts 147-1B and 147-2). In some embodiments, a seal ring 143 may be formed by coupling via direct bonding a guard ring 141 to a perimeter wall 109 (e.g., as shown in hermetic seal ring region 145A where guard ring 141-1A is coupled to perimeter wall 109 via respective surface contacts 147-1A and 147-3). In some embodiments, a seal ring 143 may be formed by coupling via direct bonding a guard ring 141 via a surface contact 147 to a conductive contact (e.g., as described below with reference to FIG. 8B). In some embodiments, a seal ring 143 may be formed on more than one surface of a microelectronic component 102 and more than one seal ring 143 may be formed. For example, as shown in FIG. 7A, the first microelectronic component 102-1 may be referred to as a double-sided component as there are conductive contacts on multiple surfaces and may include seal rings 143 on multiple surfaces. The first microelectronic component 102-1 may include first top guard rings 141-1B that extend from respective top surface contacts 147-1B through at least a portion of a thickness of and along a perimeter of the microelectronic component 102-1. The second microelectronic component 102-2 may include second guard rings 141-2 that extend from respective surface contacts 147-2 through at least a portion of a thickness of and along a perimeter of the microelectronic component 102-2. The first top guard ring 141-1B may be coupled via direct bonding to the second guard ring 141-2, via the first top surface contact 147-1B and the second surface contact 147-2 to form two concentric seal rings 143 between the first and second microelectronic components 102-1, 102-2 around the DB region 130-4 (e.g., positioned adjacent to an outer edge of the first and second microelectronic components 102-1, 102-2 in a hermetic seal ring region 145B). The seal rings 143 provide a hermetic barrier around the DB region 130-4 by coupling the first contacts 147-1B of the first top guard rings 141-1B of the first microelectronic component 102-1 to the second contacts 147-2 of the second guard rings 141-2 of the second microelectronic component 102-2, respectively, and forming "extended barrier walls." The first microelectronic component 102-1 may further include a first bottom guard ring 141-1A that extends from a bottom surface contact 147-1A through at least a portion of a thickness of and along a perimeter of the microelectronic component 102-1. The interposer 150 may include first liner material 107-1, a second liner material 107-2, a perimeter wall 109 that extends through at least a portion of a thickness of and along a perimeter of the interposer 150 connected to the first and second liner materials 107-1, 107-2, and a surface contact 147-3 coupled to the perimeter wall 109 (e.g., as shown above in FIG. 4B). The first bottom guard ring 141-1A may be coupled via direct bonding to the perimeter wall 109 via the first bottom surface contact 147-1A and the surface contact 147-3 to form a concentric seal ring 143 between the first microelectronic component 102-1 and the interposer 150 around the DB region 130-3 (e.g., positioned adjacent to an outer edge of the first microelectronic component 102-1 and the interposer 150 in a hermetic seal ring region 145A). A surface contact 147 may include a pillar, a pad, or other structure. In some embodiments, a surface contact 147 may be a DB contacts 110. The guard ring 141 may be floating (e.g., not be electrically coupled to other components other than a silicon material and may function as connected to ground), may be coupled to ground, or may be coupled to a power delivery network (e.g., to be used as a peripheral path to deliver power). The guard ring 141 may be formed using any suitable technique, for example, the guard ring 141 may be formed layer by layer as the microelectronic component 102 is being formed. The seal ring 143 (e.g., the guard ring 141 and surface contact 147) may be made from any suitable material, including a conductive material. A seal ring 143 may include any one or more conductive materials, such as copper, manganese, titanium, gold, silver, palladium, nickel, copper and aluminum (e.g., in the form of a copper aluminum alloy), tantalum (e.g., tantalum metal, or tantalum and nitrogen in the form of tantalum nitride), cobalt, cobalt and iron (e.g., in the form of a cobalt iron alloy), or any alloys of any of the foregoing (e.g., copper, manganese, and nickel in the form of manganin). In some embodiments, the microelectronic components 102 may further include a barrier layer (not shown) on a surface of the die-to-die bonding interface.

FIG. 7B illustrates a microelectronic assembly 100 including a first microelectronic component 102-1 coupled to an interposer 150 via solder 120-2 and an underfill material 138-2 and coupled to a second microelectronic component 102-2 via a DB region 130-4 and a hermetic seal ring region 145. Although FIG. 7 shows a particular number of guard rings 141 on each microelectronic component 102, a microelectronic component 102 may have any suitable number of guard rings 141, including one or more than one (e.g., as shown in FIG. 8). Although FIG. 7 illustrates an interposer 150 including a perimeter wall 109 and liner materials 107, the interposer 150 may not include a perimeter wall 109 and/or the liner materials 107.

Figure 8A:
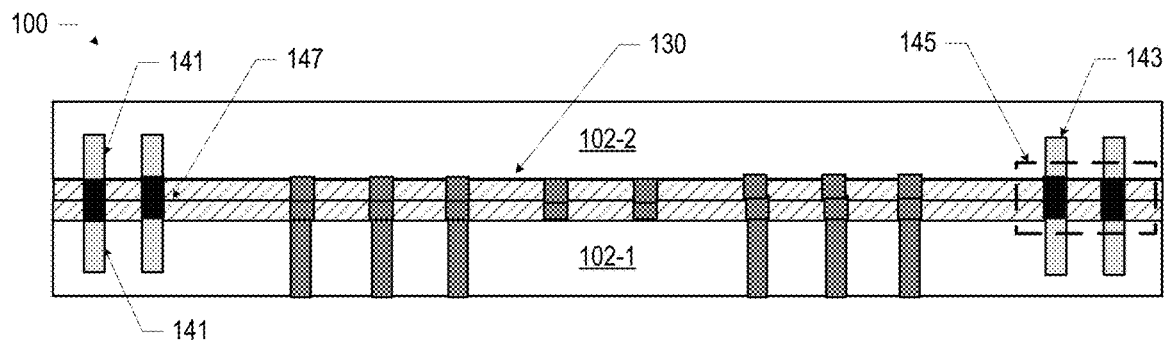
FIGS. 8A-8D are side, cross-sectional magnified views of example arrangements in microelectronic assemblies including hermetic sealing structures, in accordance with various embodiments.

FIGS. 8A-8D are side, cross-sectional views of example arrangements in microelectronic assemblies including hermetic sealing structures, in accordance with various embodiments. FIG. 8A illustrates a microelectronic assembly 100 including a first microelectronic component 102-1 coupled to a second microelectronic component 102-2 via a DB region 130 and a hermetic seal ring region 145, where the first and second microelectronic components have a same bonding surface dimension. As shown in FIG. 8A, the first and second microelectronic components 102-1, 102-2 include two guard rings 141 that extend from a surface through at least a portion of and along a perimeter of the microelectronic components 102-1, 102-2 and are coupled via the surface contacts 147 to form two concentric seal rings 143 in the hermetic seal ring region 145 between the first and second microelectronic components 102-1, 102-2.

Figure 8B:
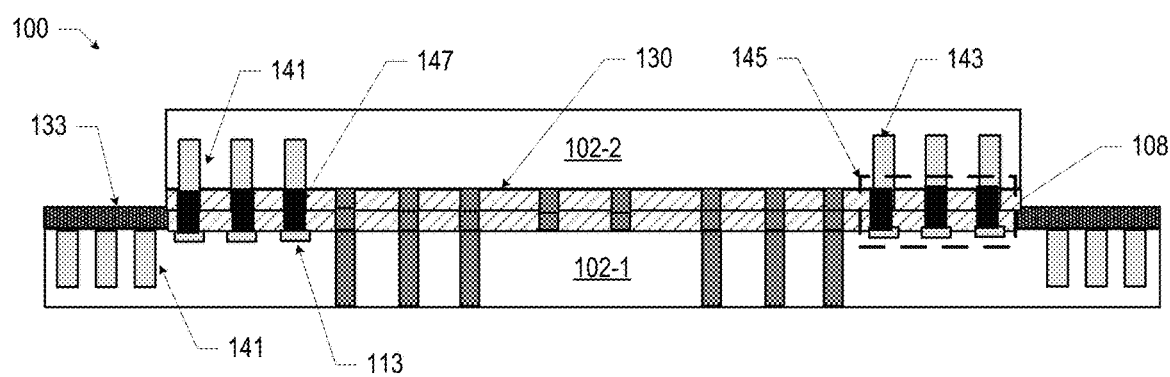

FIG. 8B illustrates a microelectronic assembly 100 including a first microelectronic component 102-1 coupled to a second microelectronic component 102-2 via a DB region 130 and a hermetic seal ring region 145, where the first microelectronic component 102-1 has a larger bonding surface area than the second microelectronic component 102-2. In embodiments where the microelectronic components 102 have different dimensions at a bonding interface (e.g., different surface areas), a dimension of the seal ring 143 is determined based on the microelectronic component having a smaller dimension. As shown in FIG. 8B, the first and second microelectronic components 102-1, 102-2 include three guard rings 141 that extend from a surface through at least a portion of and along a perimeter of the microelectronic components 102-1, 102-2. The three guard rings 141 of the second microelectronic component 102-2 are coupled via surface contacts 147 to respective conductive contacts 113 at the surface of the first microelectronic component 102-1 by direct bonding to form three concentric seal rings 143 in the hermetic seal ring region 145 between the first and second microelectronic components 102-1, 102-2. As shown in FIG. 8B, the surface of the first microelectronic component 102-1 may include a liner material 133 (e.g., such as liner material 107 described above with reference to FIG. 1) that provides a hermetic barrier. In some embodiments, as shown in FIG. 8B, the liner material 133 may cover a portion of the surface area of the first microelectronic component 102-1 that is that is not covered by the second microelectronic 102-2. In some embodiments, the liner material 133 may be an additional layer that covers the entire surface area of the first microelectronic component 102-1 and the DB dielectric 108 may be disposed on the liner material 133 (not shown). In some embodiments, as shown in FIG. 8C, the DB dielectric 108 may function as a hermetic barrier.

Figure 8C:
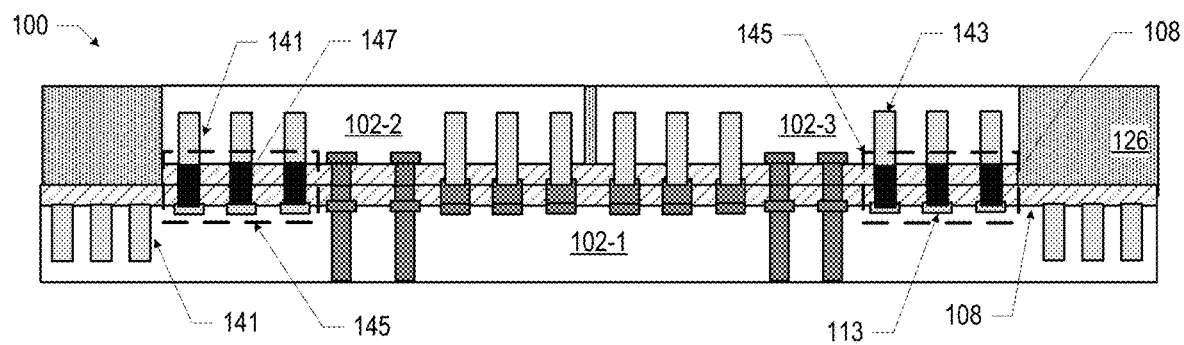

FIG. 8C illustrates a microelectronic assembly 100 including a first microelectronic component 102-1 coupled to a second microelectronic component 102-2 and a third microelectronic component 102-3 via a DB regions 130 and a hermetic seal ring region 145. As shown in FIG. 8C, the first, second, and third microelectronic components 102-1, 102-2, 102-3 include three guard rings 141 that extend from a surface through at least a portion of and along a perimeter of the microelectronic components 102-1, 102-2, 102-3. The three guard rings 141 of the second and third microelectronic component 102-2, 102-3 are coupled via surface contacts 147 to respective conductive contacts 113 at the surface of the first microelectronic component 102-1 to form three concentric seal rings 143 in the hermetic seal ring region 145 between the first and second microelectronic components 102-1, 102-2 and between the first and third microelectronic components 102-1, 102-3. As shown in FIG. 8C, the DB dielectric 108 on the surface of the first microelectronic component 102-1 may provide a hermetic barrier. As shown in FIG. 8C, the microelectronic assembly 100 may further include a mold material 126 around the second and third microelectronic components 102-2, 102-3.

Figure 8D:
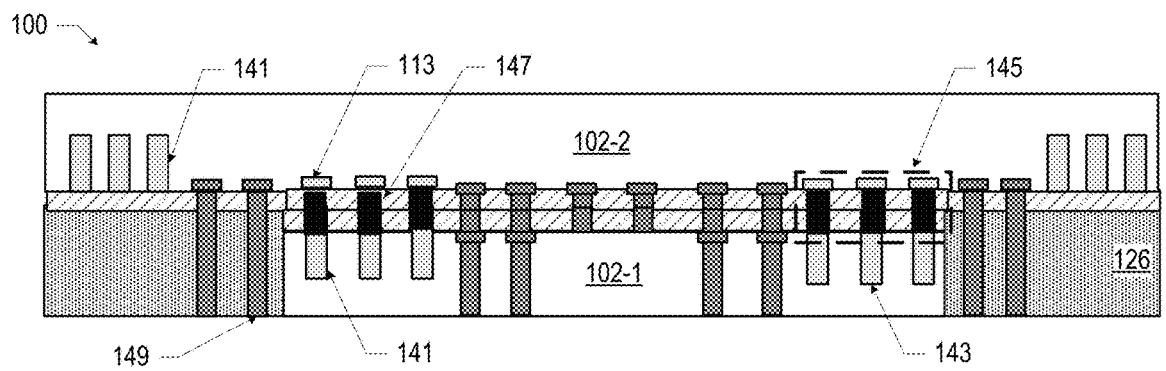

FIG. 8D illustrates a microelectronic assembly 100 including a first microelectronic component 102-1 coupled to a second microelectronic component 102-2 via a DB region 130 and a hermetic seal ring region 145, where the first microelectronic component 102-1 has a smaller bonding surface area than the second microelectronic component 102-2. In embodiments where the microelectronic components 102 have different dimensions at a bonding interface (e.g., different surface areas), a dimension of the seal ring 143 is determined based on the microelectronic component having a smaller dimension. As shown in FIG. 8D, the first and second microelectronic components 102-1, 102-2 include three guard rings 141 that extend from a surface through at least a portion of and along a perimeter of the microelectronic components 102-1, 102-2. The three guard rings 141 of the first microelectronic component 102-1 via surface contacts 147 are coupled to respective conductive contacts 113 at the surface of the second microelectronic component 102-2 to form three concentric seal rings 143 in the hermetic seal ring region 145 between the first and second microelectronic components 102-1, 102-2. As shown in FIG. 8D, the microelectronic assembly 100 may further include a mold material 126. In some such embodiments, the microelectronic assembly 100 may further include through-mold vias 149 (TMVs) that couple the second microelectronic component 102-2 to an interposer 150 (not shown) (e.g., conductive pathways for providing power, ground, and/or signals directly to the second microelectronic component 102-2).

Figure 9:
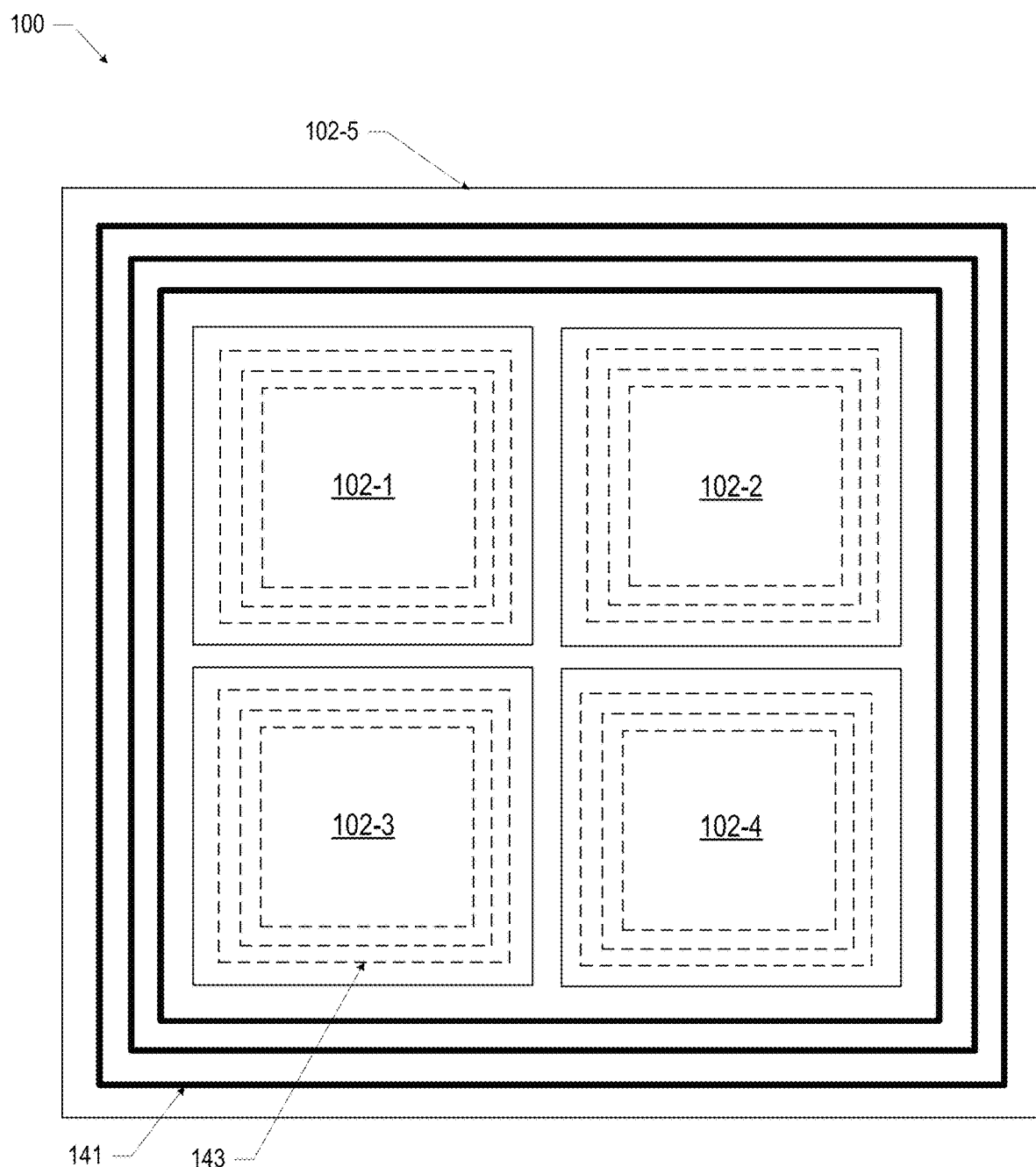
FIG. 9 is a top view schematic of an example arrangement of microelectronic components including hermetic sealing structures in a microelectronic assembly, in accordance with various embodiments.

FIG. 9 is a top view schematic of an example arrangement of microelectronic components 102 including hermetic sealing structures in a microelectronic assembly 100, in accordance with various embodiments. FIG. 9 illustrates four microelectronic components 102-1, 102-2, 102-3, 102-4 arranged in a grid on a fifth microelectronic component 102-5. Each individual microelectronic component 102 includes three guard rings 141 that couple with the fifth microelectronic component 102-5 to form three concentric seal rings 143 (e.g., as indicated by the dotted lines) between the fifth microelectronic component 102-5 and each of the four individual microelectronic components 102-1, 102-2, 102-3, 102-4. The fifth microelectronic component 102-5 includes three guard rings 141 along an outer edge that form a hermetic barrier. Although FIG. 9 shows a particular number of microelectronic components having a particular arrangement, a microelectronic assembly 100 may include any suitable number of microelectronic components in any suitable arrangement. Although FIG. 9 shows the guard rings 141 and, accordingly, the seal rings 143 as having a rectangular shape with squared corners, the guard rings 141 and the surface conductive contacts 147, along with the associated the seal rings 143 may have any suitable shape, including linear, non-linear, and/or curved (e.g., any of the shapes as described above with reference to FIG. 5).

The microelectronic components 102 and microelectronic assemblies 100 disclosed herein may be included in any suitable electronic component. FIGS. 8-11 illustrate various examples of apparatuses that may include, or be included in, as suitable, any of the microelectronic components 102 and microelectronic assemblies 100 disclosed herein.

Figure 10:
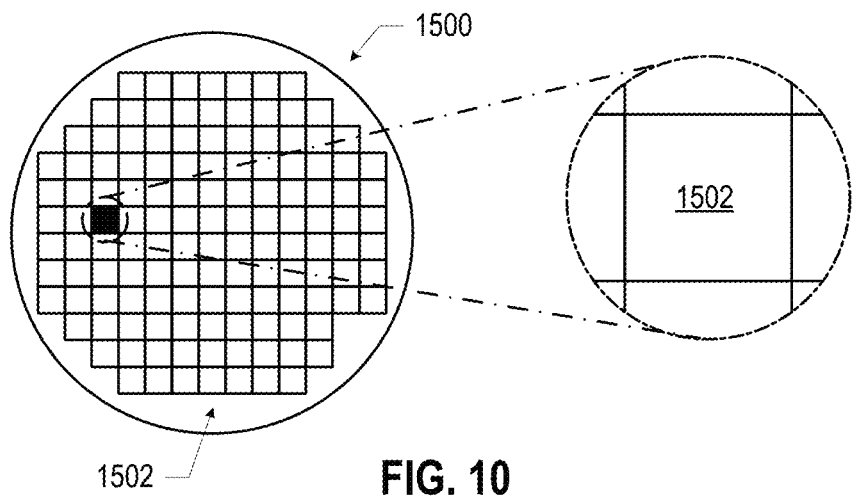
FIG. 10 is a top view of a wafer and dies that may be included in a microelectronic component in accordance with any of the embodiments disclosed herein.

FIG. 10 is a top view of a wafer 1500 and dies 1502 that may be included in any of the microelectronic components 102 disclosed herein. For example, a die 1502 may serve as a microelectronic component 102, or may be included in a microelectronic component 102. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 11, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (M RAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 13) or other logic that is configured to store information in the memory devices or execute instructions stored in the memory array.

Figure 11:
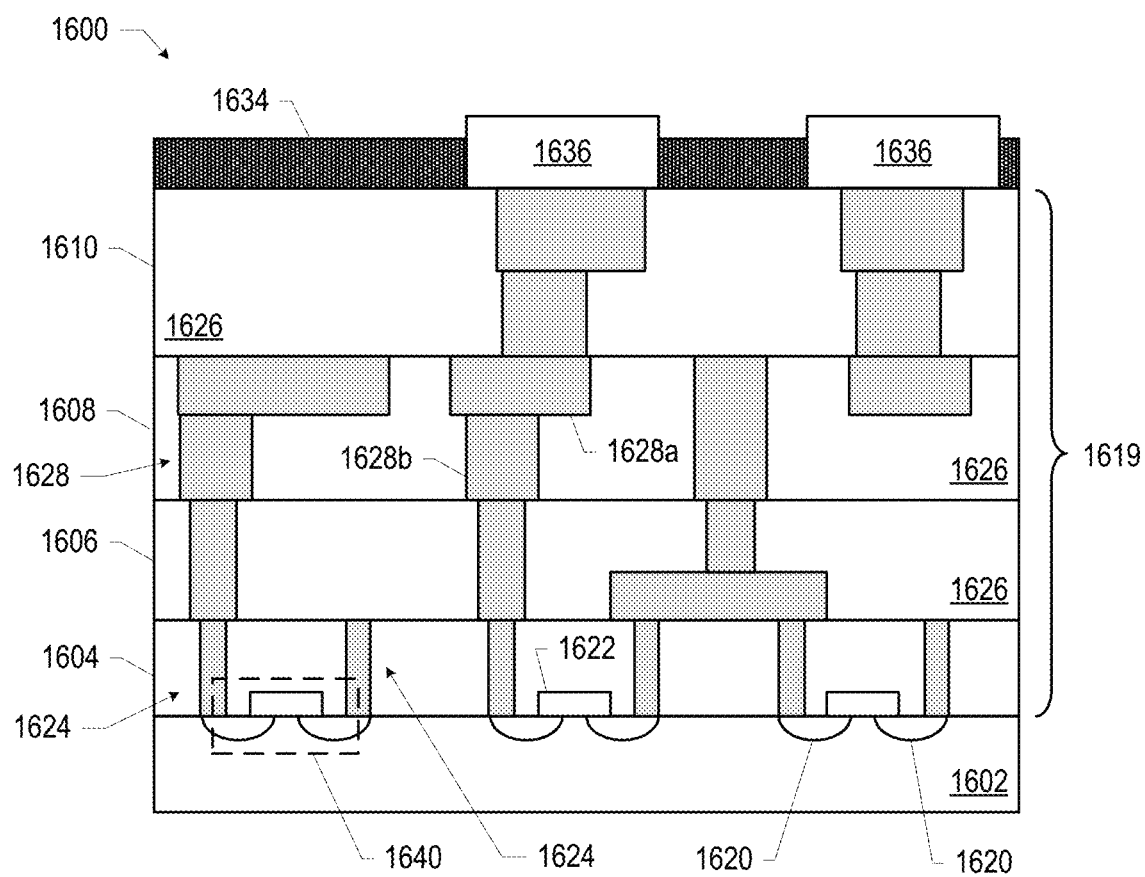
FIG. 11 is a side, cross-sectional view of an integrated circuit (IC) device that may be included in a microelectronic component in accordance with any of the embodiments disclosed herein.

FIG. 11 is a side, cross-sectional view of an IC device 1600 that may be included in any of the microelectronic components 102 disclosed herein. For example, an IC device 1600 (e.g., as part of a die 1502, as discussed above with reference to FIG. 10) may serve as a microelectronic component 102, or may be included in a microelectronic component 102. One or more of the IC devices 1600 may be included in one or more dies 1502 (FIG. 10). The IC device 1600 may be formed on a substrate 1602 (e.g., the wafer 1500 of FIG. 10) and may be included in a die (e.g., the die 1502 of FIG. 10). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 10) or a wafer (e.g., the wafer 1500 of FIG. 10).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 11 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 11 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 11). Although a particular number of interconnect layers 1606-1610 is depicted in FIG. 11, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 11. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 11. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 11, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 12:
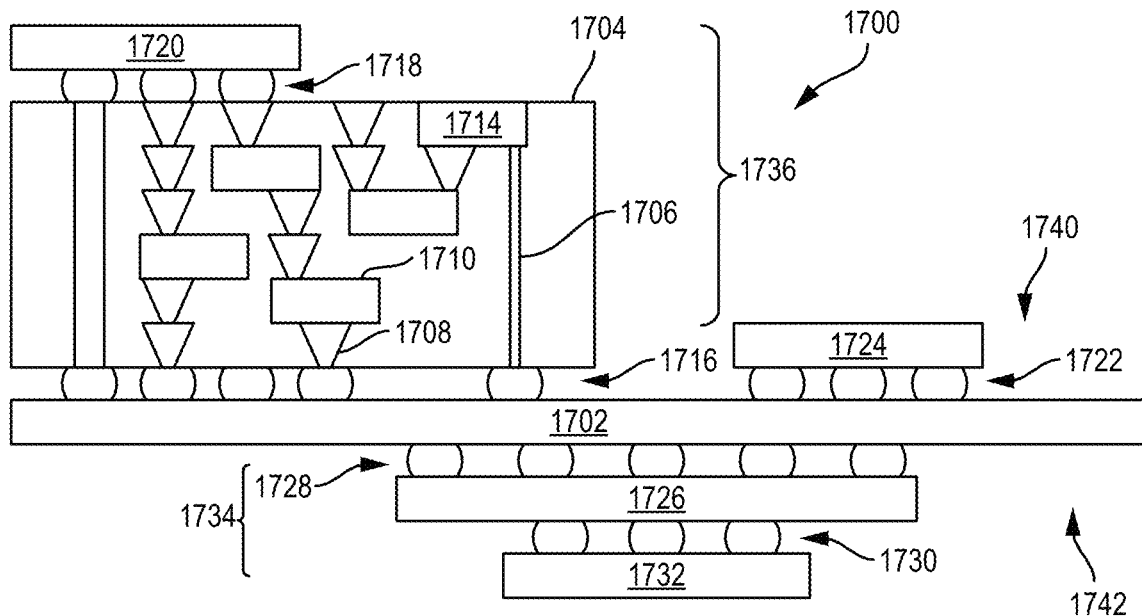
FIG. 12 is a side, cross-sectional view of an IC device assembly that may include a microelectronic assembly in accordance with any of the embodiments disclosed herein.

FIG. 12 is a side, cross-sectional view of an IC device assembly 1700 that may include any of the microelectronic components 102 and/or microelectronic assemblies 100 disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may include any of the embodiments of the microelectronic assemblies 100 disclosed herein (e.g., may include multiple microelectronic components 102 coupled together by direct bonding).

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 12 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 12), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 12, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 10), an IC device (e.g., the IC device 1600 of FIG. 11), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 12, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-oninterposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 12 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 13:
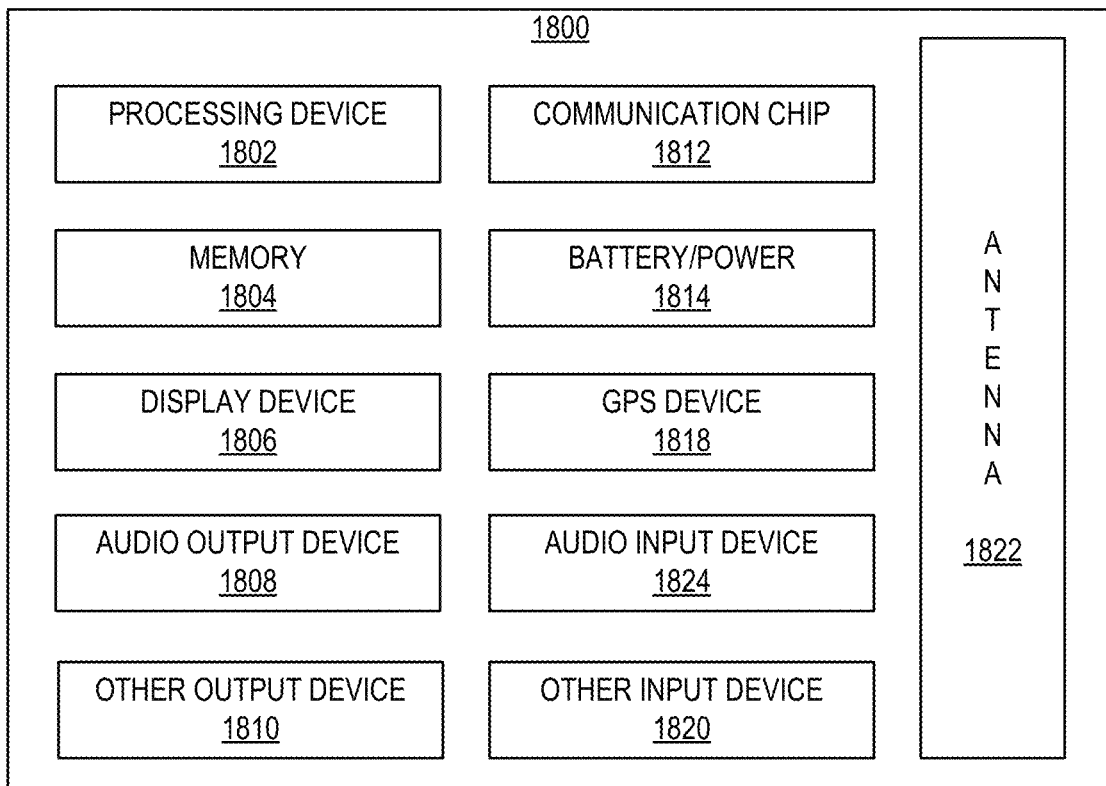
FIG. 13 is a block diagram of an example electrical device that may include a microelectronic assembly in accordance with any of the embodiments disclosed herein.

FIG. 13 is a block diagram of an example electrical device 1800 that may include any of the microelectronic components 102 and/or microelectronic assemblies 100 disclosed herein. For example, any suitable ones of the components of the electrical device 1800 may include one or more of the IC device assemblies 1700, IC devices 1600, or dies 1502 disclosed herein. A number of components are illustrated in FIG. 13 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 13, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1A is a microelectronic assembly, including an interposer, including a dielectric material, and further including a first liner material at a first surface; a second liner material at an opposing second surface; and a perimeter wall through the dielectric material and connected to the first and second liner materials; and a microelectronic component coupled to the second surface of the interposer by a direct bonding region.

Example 2A may include the subject matter of Example 1A, and may further specify that the first liner material and the second liner material include silicon and nitrogen, silicon and carbon and nitrogen, silicon and oxygen and carbon and nitrogen, silicon and carbon, aluminum and nitrogen, aluminum and oxygen, or aluminum and oxygen and nitrogen.

Example 3A may include the subject matter of Example 2A, the first liner material is a same material as the second liner material.

Example 4A may include the subject matter of Example 2A, and may further specify that the first liner material is a different material than the second liner material.

Example 5A may include the subject matter of Example 1A, and may further specify that a thickness of the first liner material and of the second liner material is between 100 nanometers and 20 microns.

Example 6A may include the subject matter of Example 1A, and may further specify that a thickness of the first liner material is between 100 nanometers and 10 microns and a thickness of the second liner material is between 100 nanometers and 20 microns.

Example 7A may include the subject matter of Example 1A, and may further specify that the direct bonding region includes a direct bonding conductive contact and the second liner material extends along at least a portion of the direct bonding conductive contact.

Example 8A may include the subject matter of Example 1A, and may further specify that a material of the perimeter wall includes silicon and nitrogen, silicon and carbon and nitrogen, silicon and oxygen and carbon and nitrogen, silicon and carbon, aluminum and nitrogen, aluminum and oxygen, aluminum and oxygen and nitrogen, copper, silver, nickel, gold, aluminum, or other metals or alloys, and combinations thereof.

Example 9A may include the subject matter of Example 8A, and may further specify that a material of the perimeter wall is a same material as the first liner material and the second liner material.

Example 10A may include the subject matter of Example 8A, and may further specify that the material of the perimeter wall is a different material than the first liner material and the second liner material.

Example 11A is a microelectronic assembly, including an interposer, having a first surface and an opposing second surface, and further including a plurality of dielectric material layers; a first liner material at the first surface, wherein the first liner material is a layer within the plurality of dielectric material layers; a second liner material at the second surface; and a perimeter wall through the plurality of dielectric material layers and connected to the first and second liner materials; and a microelectronic component coupled to the second surface of the interposer by a direct bonding region.

Example 12A may include the subject matter of Example 11A, and may further specify that the first liner material, the second liner material, and a material of the perimeter wall includes silicon and nitrogen, silicon and carbon and nitrogen, silicon and oxygen and carbon and nitrogen, silicon and carbon, aluminum and nitrogen, aluminum and oxygen, or aluminum and oxygen and nitrogen.

Example 13A may include the subject matter of Example 11A, and may further specify that a thickness of the first liner material is between 100 nanometers and 20 microns.

Example 14A may include the subject matter of Example 11A, and may further specify that the perimeter wall has linear sidewalls.

Example 15A may include the subject matter of Example 11A, and may further specify that the perimeter wall is a first perimeter wall, and the interposer further includes a second perimeter wall through the plurality of dielectric material layers and connected to the first and second liner materials, wherein the second perimeter wall is between the first perimeter wall and an outer edge of the interposer.

Example 16A is a microelectronic assembly, including an interposer, having a first surface and an opposing second surface; a liner material at the first surface of the interposer; a microelectronic component coupled to the second surface of the interposer by a direct bonding region; a mold material around the microelectronic component; and an encapsulation material on the mold material, around the interposer and connected to the liner material at the first surface of the interposer.

Example 17A may include the subject matter of Example 16A, and may further specify that the encapsulation material includes copper, aluminum, silver, diamond, graphene, ceramic, silicon and carbon, boron and nitrogen, or aluminum and nitrogen.

Example 18A may include the subject matter of Example 16A, and may further include: a circuit board coupled to the first surface of the interposer via solder; and an underfill material around the solder.

Example 19A may include the subject matter of Example 18A, and may further specify that the encapsulation material is further connected to the underfill material.

Example 20A may include the subject matter of Example 19A, and may further specify that the liner material includes silicon and nitrogen, silicon and carbon and nitrogen, silicon and oxygen and carbon and nitrogen, silicon and carbon, aluminum and nitrogen, aluminum and oxygen, or aluminum and oxygen and nitrogen.

Example 1B is a microelectronic assembly, including a first microelectronic component, having a first surface and an opposing second surface, including a guard ring extending from the second surface through at least a portion of a thickness of and along a perimeter of the first microelectronic component; a second microelectronic component, having a first surface and an opposing second surface, including a guard ring extending from the first surface through at least a portion of a thickness of and along a perimeter of the second microelectronic component, wherein the second surface of the first microelectronic component is electrically coupled to the first surface of the second microelectronic component via a direct bonding region; and a seal ring between the first and second microelectronic components, wherein the guard ring at the second surface of the first microelectronic component is coupled to the guard ring at the first surface of the second microelectronic component to form the seal ring.

Example 2B may include the subject matter of Example 1B, and may further specify that a material of the seal ring includes copper, manganese, titanium, gold, silver, palladium, nickel, copper and aluminum, tantalum, tantalum and nitrogen, cobalt, cobalt and iron, or an alloy thereof.

Example 3B may include the subject matter of Example 1B, and may further specify that the seal ring encloses the direct bonding region.

Example 4B may include the subject matter of Example 1B, and may further specify that the guard ring in the first and second microelectronic components is a first guard ring, and may further include a second guard ring in the first microelectronic component extending from the second surface through at least a portion of the thickness of and along the perimeter of the first microelectronic component; a second guard ring in the second microelectronic component extending from the first surface through at least a portion of the thickness of and along the perimeter of the second microelectronic component; and a second seal ring between the first and second microelectronic components, wherein the second guard ring at the second surface of the first microelectronic component is coupled to the second guard ring at the first surface of the second microelectronic component to form the second seal ring.

Example 5B may include the subject matter of Example 4B, and may further specify that the second seal ring is concentric with the first seal ring.

Example 6B may include the subject matter of Example 1B, and may further include a barrier layer at the second surface of the first microelectronic component.

Example 7B may include the subject matter of Example 1B, and may further specify that the first microelectronic component includes a through substrate via (TSV), and may further include an interposer coupled to the TSV at the first surface of the first microelectronic component.

Example 8B may include the subject matter of Example 7B, and may further specify that the interposer is coupled to the TSV by direct bonding.

Example 9B may include the subject matter of Example 7B, and may further specify that the interposer is coupled to the TSV by solder.

Example 1013 may include the subject matter of Example 9B, and may further include an underfill material around the solder.

Example 11B is a microelectronic assembly, including a first microelectronic component, having a first surface and an opposing second surface, including a conductive contact at the second surface, wherein the first microelectronic component has a first bonding surface area; a second microelectronic component, having a first surface and an opposing second surface, including a guard ring extending from the first surface through at least a portion of a thickness of and along a perimeter of the second microelectronic component, wherein the second surface of the first microelectronic component is electrically coupled to the first surface of the second microelectronic component via a direct bonding region, and wherein the second microelectronic component has a second bonding surface area that is smaller than the first bonding surface area; and a seal ring between the first and second microelectronic components, wherein the conductive contact at the second surface of the first microelectronic component is coupled to the guard ring at the first surface of the second microelectronic component to form the seal ring.

Example 12B may include the subject matter of Example 11B, and may further specify that a material of the seal ring includes copper, manganese, titanium, gold, silver, palladium, nickel, copper and aluminum, tantalum, tantalum and nitrogen, cobalt, cobalt and iron, or an alloy thereof.

Example 13B may include the subject matter of Example 11B, and may further specify that the seal ring encloses the direct bonding region.

Example 14B may include the subject matter of Example 11B, and may further specify that the conductive contact at the second surface of the first microelectronic component is a first conductive contact, wherein the guard ring in the second microelectronic component is a first guard ring, and may further include a second conductive contact at the second surface of the first microelectronic component; a second guard ring in the second microelectronic component extending from the first surface through at least a portion of the thickness of and along the perimeter of the second microelectronic component; and a second seal ring between the first and second microelectronic components, the second conductive contact at the second surface of the first microelectronic component is coupled to the second guard ring at the first surface of the second microelectronic component to form the second seal ring, wherein the second seal ring is concentric with the first seal ring.

Example 15B may include the subject matter of Example 14B, and may further specify that the first microelectronic component further includes a guard ring extending from the second surface through at least a portion of a thickness of and along a perimeter of the first microelectronic component.

Example 16B is a microelectronic assembly, including a first microelectronic component, having a first surface and an opposing second surface, including a guard ring extending from the second surface through at least a portion of a thickness of and along a perimeter of the first microelectronic component, including a conductive contact at the second surface, wherein the first microelectronic component has a first bonding surface area; a second microelectronic component, having a first surface and an opposing second surface, including a conductive contact at the first surface, wherein the second surface of the first microelectronic component is electrically coupled to the first surface of the second microelectronic component via a direct bonding region, and wherein the second microelectronic component has a second bonding surface area that is larger than the first bonding surface area; and a seal ring between the first and second microelectronic components, wherein the guard ring at the second surface of the first microelectronic component is coupled to the conductive contact at the first surface of the second microelectronic component to form the seal ring.

Example 17B may include the subject matter of Example 16B, and may further specify that a material of the seal ring includes copper, manganese, titanium, gold, silver, palladium, nickel, copper and aluminum, tantalum, tantalum and nitrogen, cobalt, cobalt and iron, or an alloy thereof.

Example 18B may include the subject matter of Example 16B, and may further specify that a material of the guard ring includes copper, manganese, titanium, gold, silver, palladium, nickel, copper and aluminum, tantalum, tantalum and nitrogen, cobalt, cobalt and iron, or an alloy thereof.

Example 19B may include the subject matter of Example 16B, and may further include a package substrate coupled to the first surface of the first microelectronic component; and a mold material around first and second microelectronic components.

Example 20B may include the subject matter of Example 19B, and may further include a through mold via (TMV) coupling the second microelectronic component to the package substrate.

The invention claimed is:

1. A microelectronic assembly, comprising:
an interposer, including a dielectric material and having a perimeter, comprising:
a first liner material at a first surface;
a second liner material at an opposing second surface; and
a hermetic seal encapsulating an inner portion of the interposer and comprising a perimeter wall through the dielectric material, wherein the perimeter wall is along the entire perimeter of the interposer and connected along the entire perimeter to both of the first and second liner materials, and wherein a material of the perimeter wall includes silicon and nitrogen, silicon and carbon and nitrogen, silicon and oxygen and carbon and nitrogen, silicon and carbon, aluminum and nitrogen, aluminum and oxygen, or aluminum and oxygen and nitrogen; and
a microelectronic component coupled to the second surface of the interposer by a direct bonding region.

2. The microelectronic assembly of claim 1, wherein the first liner material and the second liner material include silicon and nitrogen, silicon and carbon and nitrogen, silicon and oxygen and carbon and nitrogen, silicon and carbon, aluminum and nitrogen, aluminum and oxygen, or aluminum and oxygen and nitrogen.

3. The microelectronic assembly of claim 2, the first liner material is a same material as the second liner material.

4. The microelectronic assembly of claim 2, wherein the first liner material is a different material than the second liner material.

5. The microelectronic assembly of claim 1, wherein a thickness of the first liner material and of the second liner material is between 100 nanometers and 20 microns.

6. The microelectronic assembly of claim 1, wherein a thickness of the first liner material is between 100 nanometers and 10 microns and a thickness of the second liner material is between 100 nanometers and 20 microns.

7. The microelectronic assembly of claim 1, wherein the direct bonding region includes a direct bonding conductive contact and the second liner material extends along at least a portion of the direct bonding conductive contact.

8. The microelectronic assembly of claim 1, wherein the material of the perimeter wall is a same material as the first liner material and the second liner material.

9. The microelectronic assembly of claim 1, wherein the material of the perimeter wall is a different material than the first liner material and the second liner material.

10. A microelectronic assembly, comprising:
an interposer, having a perimeter, a first surface, and an opposing second surface, comprising:
a plurality of dielectric material layers;
a first liner material at the first surface, wherein the first liner material is a layer within the plurality of dielectric material layers;
a second liner material at the second surface; and
a hermetic seal encapsulating an inner portion of the interposer and comprising a perimeter wall through the plurality of dielectric material layers, wherein the perimeter wall is along the entire perimeter of the interposer and connected along the entire perimeter to both of the first and second liner materials, and wherein a material of the perimeter wall includes silicon and nitrogen, silicon and carbon and nitrogen, silicon and oxygen and carbon and nitrogen, silicon and carbon, aluminum and nitrogen, aluminum and oxygen, or aluminum and oxygen and nitrogen; and
a microelectronic component coupled to the second surface of the interposer by a direct bonding region.

11. The microelectronic assembly of claim 10, wherein the first liner material, the second liner material, and a material of the perimeter wall includes silicon and nitrogen, silicon and carbon and nitrogen, silicon and oxygen and carbon and nitrogen, silicon and carbon, aluminum and nitrogen, aluminum and oxygen, or aluminum and oxygen and nitrogen.

12. The microelectronic assembly of claim 10, wherein a thickness of the first liner material is between 100 nanometers and 20 microns.

13. The microelectronic assembly of claim 10, wherein the perimeter wall has linear sidewalls.

14. The microelectronic assembly of claim 10, wherein the perimeter wall is a first perimeter wall, and the interposer further comprises:
- a second perimeter wall through the plurality of dielectric material layers and connected to the first and second liner materials, wherein the second perimeter wall is between the first perimeter wall and an outer edge of the interposer.

15. A microelectronic assembly, comprising:
- an interposer, including a dielectric material and having a perimeter, a first surface, and an opposing second surface;
- a first liner material at the first surface of the interposer;
- a second liner material at the second surface of the interposer;
- a hermetic seal encapsulating an inner portion of the interposer and comprising a perimeter wall through the dielectric material, wherein the perimeter wall is along the entire perimeter of the interposer and connected along the entire perimeter to both of the first and second liner materials, wherein a material of the perimeter wall includes silicon and nitrogen, silicon and carbon and nitrogen, silicon and oxygen and carbon and nitrogen, silicon and carbon, aluminum and nitrogen, aluminum and oxygen, or aluminum and oxygen and nitrogen;
- a microelectronic component coupled to the second surface of the interposer by a direct bonding region;
- a mold material around the microelectronic component; and
- an encapsulation material on the mold material, around the interposer and connected to the first liner material at the first surface of the interposer.

16. The microelectronic assembly of claim 15, wherein the encapsulation material includes copper, aluminum, silver, diamond, graphene, ceramic, silicon and carbon, boron and nitrogen, or aluminum and nitrogen.

17. The microelectronic assembly of claim 15, further comprising:
- a circuit board coupled to the first surface of the interposer via solder; and
- an underfill material around the solder.

18. The microelectronic assembly of claim 17, wherein the encapsulation material is further connected to the underfill material.

19. The microelectronic assembly of claim 15, wherein the first liner material includes silicon and nitrogen, silicon and carbon and nitrogen, silicon and oxygen and carbon and nitrogen, silicon and carbon, aluminum and nitrogen, aluminum and oxygen, or aluminum and oxygen and nitrogen.

\* \* \* \* \*